US008257546B2

(12) United States Patent
Davis et al.

(10) Patent No.: US 8,257,546 B2
(45) Date of Patent: Sep. 4, 2012

(54) METHOD AND SYSTEM FOR MONITORING AN ETCH PROCESS

(75) Inventors: Matthew Fenton Davis, Brookdale, CA (US); John M. Yamartino, Palo Alto, CA (US); Lei Lian, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1450 days.

(21) Appl. No.: 10/674,568

(22) Filed: Sep. 29, 2003

(65) Prior Publication Data
US 2004/0203177 A1 Oct. 14, 2004

Related U.S. Application Data

(60) Provisional application No. 60/479,601, filed on Jun. 18, 2003, provisional application No. 60/462,493, filed on Apr. 11, 2003, provisional application No. 60/490,795, filed on Jul. 28, 2003.

(51) Int. Cl.
*H01L 21/00* (2006.01)
(52) U.S. Cl. ......... 156/345.25; 156/345.24; 156/345.26; 438/9; 438/689; 438/706; 438/710; 216/67
(58) Field of Classification Search .............. 216/41, 216/67; 156/345.24, 345.25, 345.26, 345.27, 156/345.28; 438/9, 710, 717
See application file for complete search history.

(56) References Cited

U.S. PATENT DOCUMENTS

| 4,767,496 | A | 8/1988 | Hieber | 156/627 |
| 5,329,381 | A * | 7/1994 | Payne | 358/3.29 |
| 5,798,529 | A | 8/1998 | Wagner | 250/492.2 |
| 5,926,690 | A | 7/1999 | Toprac et al. | 438/17 |
| 5,948,203 | A | 9/1999 | Wang | 156/345 |
| 6,004,706 | A | 12/1999 | Ausschnitt et al. | 430/30 |
| 6,027,842 | A | 2/2000 | Ausschnitt et al. | 430/30 |
| 6,130,415 | A * | 10/2000 | Knoot | 219/502 |
| 6,136,712 | A * | 10/2000 | Klippert, II et al. | 438/692 |
| 6,161,054 | A | 12/2000 | Rosenthal et al. | 700/121 |
| 6,245,581 | B1 | 6/2001 | Bonser et al. | 438/8 |
| 6,319,767 | B1 * | 11/2001 | Cha et al. | 438/250 |

(Continued)

FOREIGN PATENT DOCUMENTS
EP 0 735 565 10/1996
(Continued)

OTHER PUBLICATIONS

Lee, et al., "Analysis of Reflectometry and Ellipsometry Data from Patterned Structures," Characterization and Metrology for UCSI Technology: 1998 International Conference, Seiler, et al., eds., p. 331-335.

(Continued)

*Primary Examiner* — Ram N. Kackar
(74) *Attorney, Agent, or Firm* — Patterson & Sheridan, LLP

(57) ABSTRACT

A method and apparatus for monitoring an etch process. The etch process may be monitored using measurement information (e.g., critical dimensions (CD), layer thickness, and the like) provided ex-situ with respect to the etch process in combination with in-situ monitoring (e.g., spectroscopy, interferometry, scatterometry, reflectometry, and the like) performed during the etch process. The ex-situ measurement information in combination with the in-situ monitoring may be used to monitor for example, an endpoint of an etch process, an etch depth profile of a feature formed on a substrate, fault detection of an integrated circuit manufacturing process, and the like.

37 Claims, 18 Drawing Sheets

U.S. PATENT DOCUMENTS

| | | | |
|---|---|---|---|
| 6,368,982 B1 * | 4/2002 | Yu | 438/753 |
| 6,379,980 B1 * | 4/2002 | Toprac | 438/8 |
| 6,390,019 B1 * | 5/2002 | Grimbergen et al. | 118/723 R |
| 6,406,924 B1 * | 6/2002 | Grimbergen et al. | 438/9 |
| 6,424,417 B1 | 7/2002 | Cohen et al. | 356/388 |
| 6,486,492 B1 | 11/2002 | Su | 257/48 |
| 6,566,025 B1 | 5/2003 | McStravick et al. | |
| 6,616,759 B2 * | 9/2003 | Tanaka et al. | 118/63 |
| 2002/0006677 A1 * | 1/2002 | Egermeier et al. | 438/14 |
| 2002/0056700 A1 | 5/2002 | Ohmori | |
| 2002/0171828 A1 | 11/2002 | Cohen et al. | 356/328 |
| 2003/0010750 A1 * | 1/2003 | Petrucci et al. | 216/59 |
| 2003/0141572 A1 * | 7/2003 | Wilby | 257/632 |
| 2003/0222231 A1 * | 12/2003 | Yonezawa et al. | 250/559.45 |
| 2004/0028267 A1 * | 2/2004 | Shoham et al. | 382/141 |
| 2004/0060659 A1 * | 4/2004 | Morioka et al. | 156/345.26 |

FOREIGN PATENT DOCUMENTS

| | | | |
|---|---|---|---|
| EP | 0 932 194 | | 7/1999 |
| JP | 02-303022 A | | 12/1990 |
| JP | 11251252 | * | 9/1999 |
| JP | 2000003842 A | | 1/2000 |
| JP | 2000-155023 A | | 6/2000 |
| JP | 2002-518823 A | | 6/2002 |
| KR | 100257903 B1 | | 8/2000 |
| WO | WO-9965056 A1 | | 12/1999 |
| WO | WO 0124254 A1 | * | 4/2001 |
| WO | WO 02/09170 | | 1/2002 |
| WO | WO 2004/044974 | | 5/2004 |

OTHER PUBLICATIONS

Raymond, "Angle-resolved scatterometry for semiconductor manufacture,", Microlithography World, Winter 2000.

Toprac, A., "AMD's Advanced Process Control of Ply-Gate Critical Dimension," Proc. SPIE vol. 3882, p. 62-65, Sep. 1999.

Yang, et al., "Line-profile and Critical Dimension Measurements Using a Normal Incidence Optical Metrology System," Proceedings of SPIE vol. 4689, Mar. 2002.

Partial European Search Report dated Dec. 30, 2005 for Applicaton No. EP 04014186.3.

EPO Communication for Application No. 04014186.3 dated Mar. 27, 2006.

Official Letter from Japanese Patent Office for JP 2004-177875 dated Jul. 13, 2010.

Official Letter from Korean Patent Office for KR 10-2004-004300 dated Jan. 31, 2011.

Official Letter dated Feb. 24, 2011, from Taiwan Patent Office for corresponding Taiwan Patent Application No. 093116380.

Official Letter from Japanese Patent Office for JP 2004-177875 dated Jul. 19, 2011.

* cited by examiner

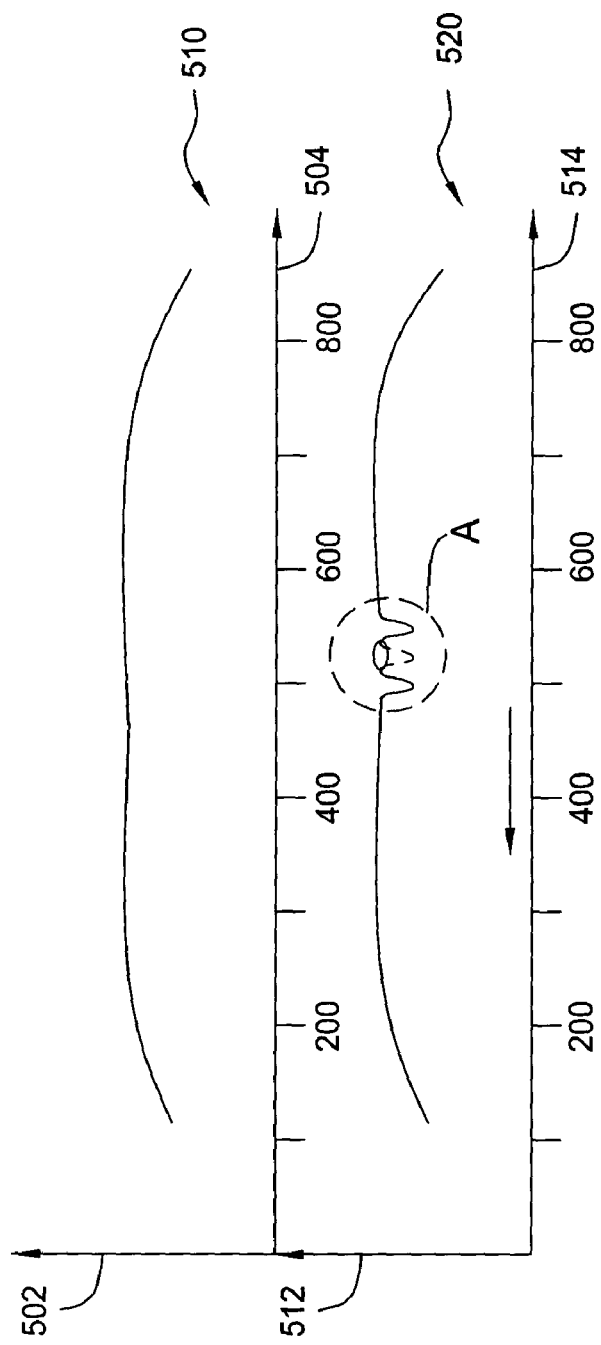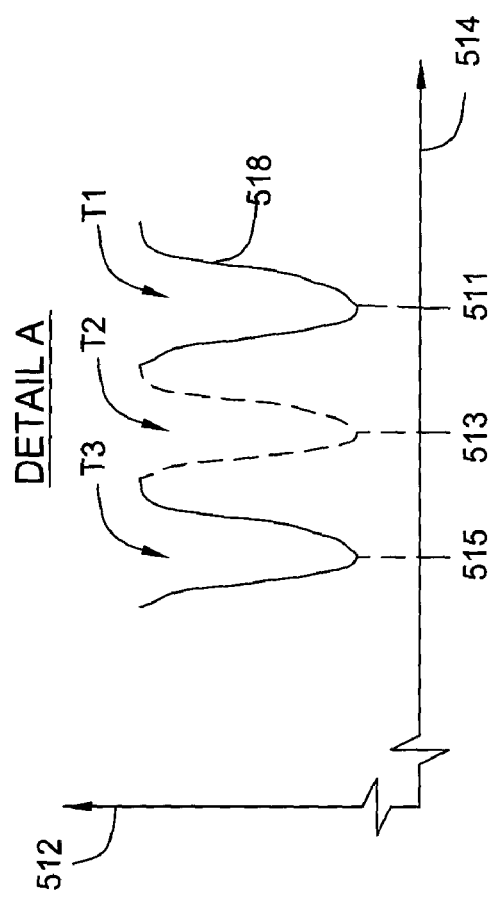

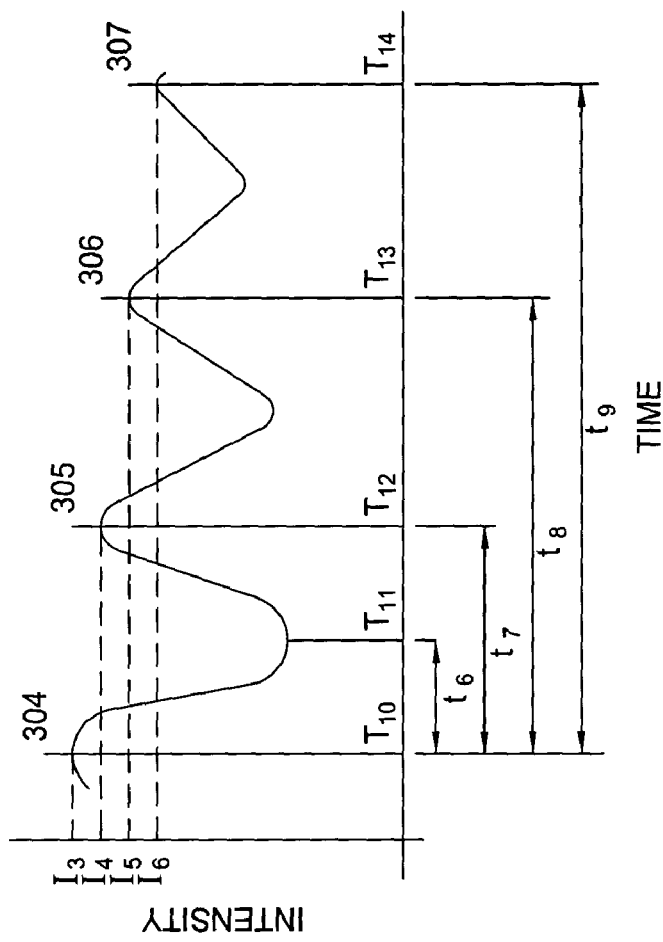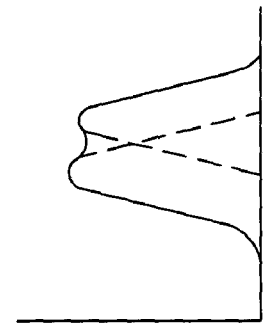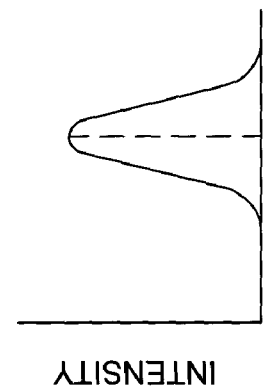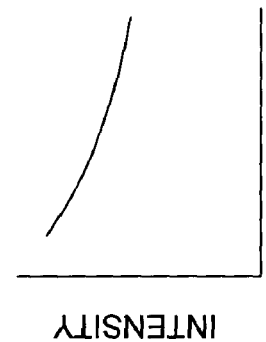

METHOD AND SYSTEM FOR MONITORING AN ETCH PROCESS

CROSS-REFERENCE TO RELATED APPLICATION

This application claims the benefit of U.S. Provisional Application No. 60/479,601 filed Jun. 18, 2003, U.S. Provisional Application No. 60/462,493 filed Apr. 11, 2003 and U.S. Provisional Application No. 60/490,795 filed Jul. 28, 2003, which are hereby incorporated by reference.

BACKGROUND OF THE INVENTION

1. Field of the Invention

The present invention generally relates to semiconductor substrate processing systems. More specifically, the present invention relates to a method and apparatus for monitoring an etch process.

2. Description of the Related Art

To increase operational speed, devices (e.g., transistors, capacitors, and the like) in integrated microelectronic circuits have become ever smaller. One method of fabricating such devices comprises forming a patterned mask (e.g., photoresist mask) on a material layer formed on a substrate and then etching the material layer using the patterned mask as an etch mask. The etch mask generally is a replica of the structure being formed (i.e., etched) in the underlying material layer (or layers). As such the etch mask has the same topographic dimensions as the structures to be formed in the underlying layer(s).

Typically, the smallest widths for elements of an etch mask, such as lines, columns, openings, spaces between lines, and the like are measured. Such smallest widths are known as "critical dimensions", or CDs. In advanced ultra large scale integrated (ULSI) circuits, the critical dimensions are generally sub-micron dimensions of about 20 to 200 nm. Additionally, thickness measurements for material layers to be etched are ascertained. Parameters for an etch process recipe are generally selected using statistically generated results of the critical dimension measurements of the patterned masks formed on wafers as well as the thickness measurements of material layers to be etched.

Accurate etch process monitoring is critical when etching a material layer using a patterned mask. In particular, manufacturing variables for the etch process may decrease dimensional accuracy of devices formed therewith, as well as cause a broad statistical distribution (i.e., a large σ, where is σ a standard deviation) for the dimensions of devices formed on substrates within a group (i.e., batch) of substrates.

Therefore, there is a need in the art for improved etch process monitoring in the fabrication of integrated circuits.

SUMMARY OF THE INVENTION

The present invention is a method and system for monitoring an etch process. The etch process may be monitored using measurement information (e.g., critical dimensions (CD), layer thickness, and the like) provided ex-situ with respect to the etch process in combination with in-situ monitoring (e.g., spectroscopy, interferometry, scatterometry, reflectometry, and the like) performed during the etch process. The ex-situ measurement information in combination with the in-situ monitoring may be used to monitor for example, an endpoint of an etch process, an etch depth profile of a feature formed on a substrate, fault detection of an integrated circuit manufacturing process, and the like.

The ex-situ measurement information is performed prior to and/or after the etch process. The ex-situ measurement information is provided to an etch reactor and is used during the etch process in combination with the in-situ monitoring. The ex-situ measurements may be performed using measurement equipment integrated with the etch reactor (e.g., modules of the same etching system) or alternatively provided from measurement equipment not integrated with the etch reactor (e.g., stand alone equipment). The in-situ monitoring may be performed using measurement equipment coupled to the etch reactor.

BRIEF DESCRIPTION OF THE DRAWINGS

The teachings of the present invention can be readily understood by considering the following detailed description in conjunction with the accompanying drawings, in which:

FIGS. 6A-6B depict a series of graphs illustrating changes in the spectral intensity of radiation reflected from a substrate during a mask trimming process;

FIG. 9E depicts a graph of an interference fringe intensity versus frequency during decreasing intensity periods;

FIG. 9F depicts a graph of the interference fringe intensity versus frequency between times $T_{10}$ to $T_{11}$ of FIG. 9E;

FIG. 9G depicts a graph of the interference fringe intensity versus frequency between times $T_{10}$ to $T_{12}$ of FIG. 9E;

FIG. 9H depicts a graph of the interference fringe intensity versus frequency between times $T_{10}$ to $T_{13}$ of FIG. 9E;

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method and system for monitoring an etch process. The etch process is monitored using measurement information (e.g., critical dimensions (CD), layer thickness, and the like) provided ex-situ with respect to the etch process in combination with in-situ monitoring (e.g., spectroscopy, interferometry, scatterometry, reflectometry, and the like) performed during the etch process. The ex-situ measurement information in combination with the in-situ monitoring may be used to monitor for example, an endpoint of an etch process, an etch depth profile of a feature formed on a substrate, fault detection of an integrated circuit manufacturing process, and the like. Fault detection of an integrated circuit manufacturing process may include for example, monitoring the etch process to determine when the critical dimensions (CD) of features being etched are outside of a pre-determined range so as to halt such process.

Ex-situ measurement information is performed prior to and/or after the etch process. The ex-situ measurement information is provided to an etch reactor and is used during the etch process in combination with the in-situ monitoring. The ex-situ measurements may be performed using measurement equipment integrated with the etch reactor (e.g., modules of the same etching system) or alternatively provided from measurement equipment not integrated with the etch reactor (e.g., stand alone equipment). The in-situ monitoring may be performed using measurement equipment coupled to the etch reactor.

Figure 1:
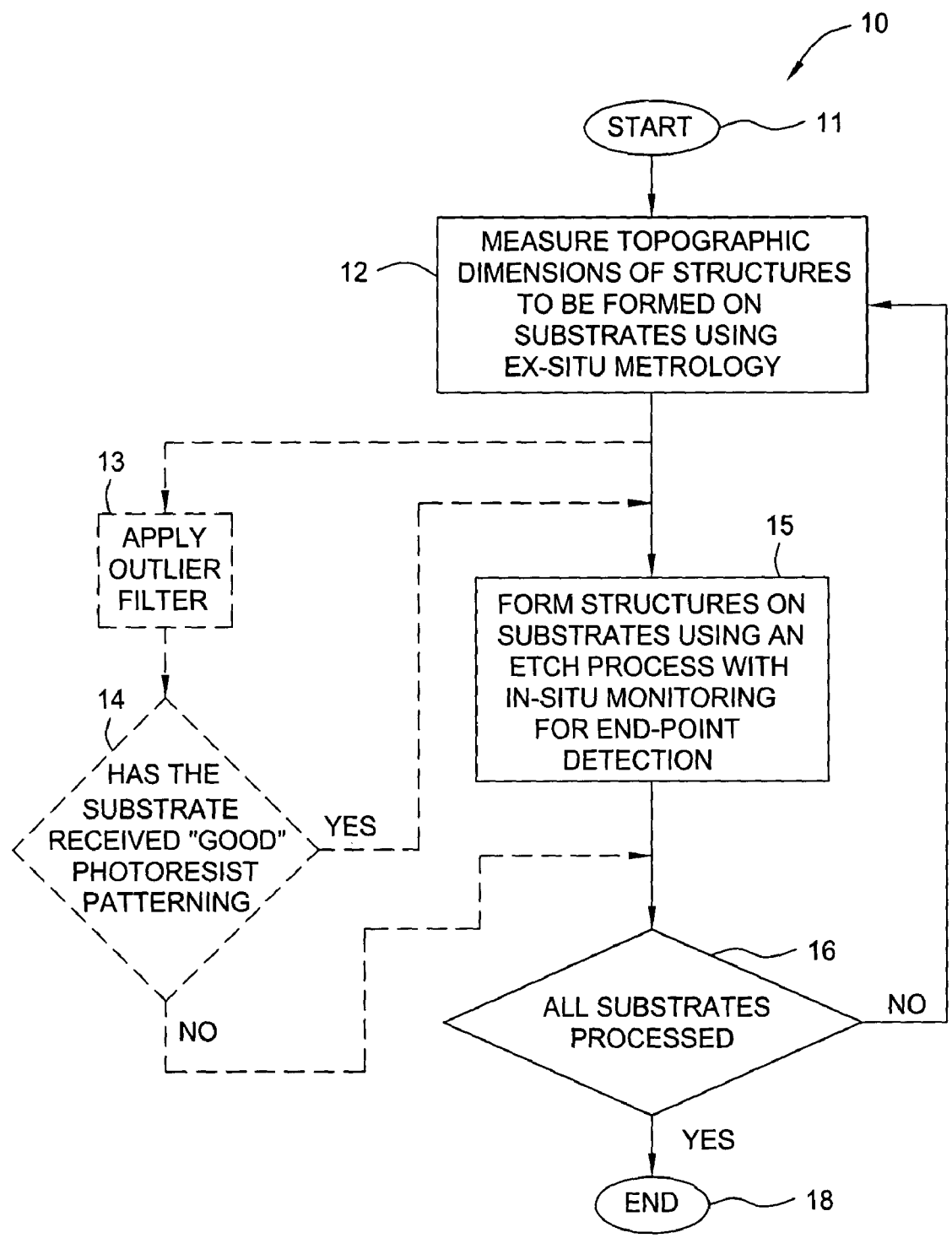
FIG. 1 depicts a flow diagram of a method for monitoring an etch process according to the present invention.

FIG. 1 depicts a flow diagram of the inventive method for monitoring an etch process as sequence 10. The sequence 10 includes a series of processing steps, which may be performed on test and product substrates to accomplish the method.

The sequence 10 starts at step 11 and proceeds to step 12. At step 12, measurement information is provided ex-situ to the etch process. In one embodiment, the ex-situ measurement information comprises critical dimension (CD) information, i.e., the width of the structures, as well as the height of for example a patterned mask. The ex-situ measurement information is generally provided for each substrate of a batch of the substrates. Such ex-situ measurements may be performed using measurement equipment integrated with the etch reactor (e.g., modules of the same etching system) or alternatively provided from measurement equipment not integrated with the etch reactor (e.g., stand alone equipment).

In one exemplary embodiment, such ex-situ measurement information is determined using a TRANSFORMA™ metrology module of the CENTURA® processing system, available from Applied Materials of Santa Clara, Calif. The TRANSFORMA™ metrology module may use one or more non-destructive optical measuring techniques, such as spectroscopy, interferometry, scatterometry, reflectometry, ellipsometry, and the like. The measured parameters include topographic dimensions and profiles of the structures fabricated on substrates, as well as a thickness of either patterned or blanket dielectric and conductive films. Measurements for critical dimensions of the structures are typically performed in a plurality of regions of the substrate, such as a statistically significant number of regions (e.g., 5 to 9 or more regions), and then averaged for such a substrate.

Alternatively, the measurement information may be provided to the etch reactor from measurement equipment (e.g., stand alone equipment) not integrated with the etch reactor. Such stand-alone equipment may provide measurement information using scanning electron microscopy (SEM), atomic force metrology (AFM), optical metrology, surface profiling, and the like.

The ex-situ measurement information may include information related to the topographic dimensions and profiles of the structures to be fabricated. In addition, film thicknesses of either blanket or patterned films (e.g., dielectric films and conductive films) may be provided along with mapping information (e.g., location on a substrate) with respect to film thickness uniformity across topographic structures formed on the substrate.

Since the ex-situ measurements are used to set the parameters of a subsequent process, any anomalies in the measured data can cause the process parameters to be incorrectly established, resulting in incorrectly processed substrates. The anomalies could be a result of poor photoresist patterning or measurement errors due to local wafer surface condition or defect. To avoid having the process parameters established using incorrect measurement data, an optional outlier filter can be used to remove from the data set any ex-situ data measurements that are not correct. At step 13 (shown in phantom to indicate that this step is optional), an outlier filter is applied to the ex-situ measurement data to remove any data points that are outliers. The outlier filter can also examine the measurement results, such as means, maximum, minimum, standard deviations, goodness of fits and the likes, to determine if the substrate has received good photoresist patterning. Step 14 queries if the substrate passes the "good" patterning criteria, the substrate should receive etch process as described in step 15. If the results do not pass the "good" patterning criteria at step 14, the substrate will not receive etch process and will be marked by the system for remeasurement, re-examination or rework.

At step 15, the etch process is performed. The etch reactor within which the etch process is performed includes an in-situ monitoring apparatus configured to measure, in real time, metrics associated with the etch process. Performing in-situ real time monitoring during the etch process enhances the determination of, for example, the endpoint for such etch process independent of the etch rate. Additionally, such in-situ monitoring may provide fault detection determination with respect to the etch process (e.g., non-uniformities within the etch process outside of a predetermined range) as well as provide specific critical dimension information with respect to elements identified using ex-situ mapping of the substrate.

Figure 1A:
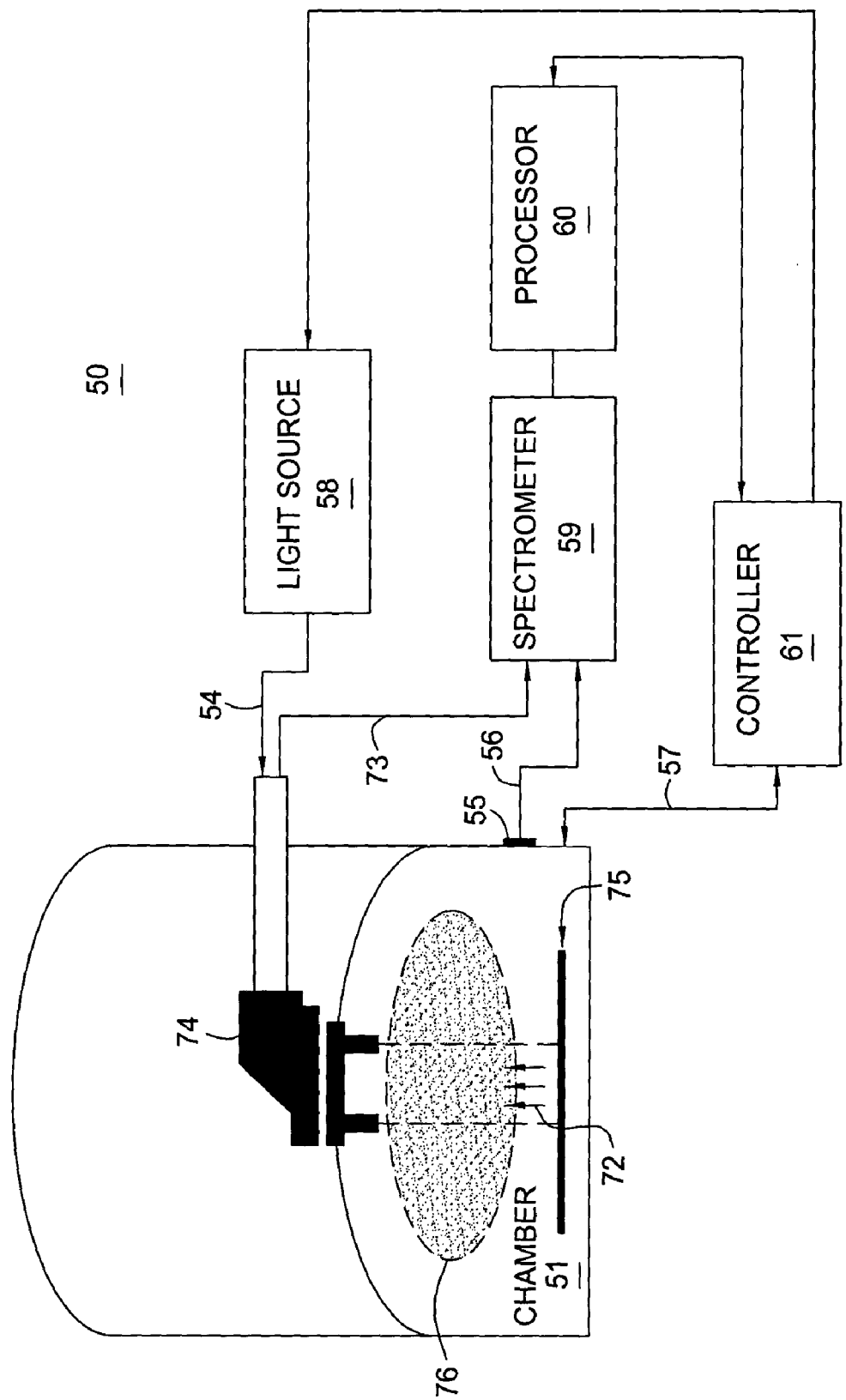
FIG. 1A depicts an in-situ metrology tool with interferometric and/or spectrometric measurement assembly and an optical electromagnetic emission (OES) monitoring assembly.

In one exemplary embodiment, the in-situ metrology tool may be the EyeD™ metrology module, available from Applied Materials of Santa Clara, Calif. As shown in FIG. 1A, EyeD™ chamber module 50 comprises of two parts. One is an interferometric and/or spectrometric measurement assembly to measure the film thickness and/or the width of structures. The other is an optical electromagnetic emission (OES) monitor assembly to monitor the chamber plasma state.

Figure 1B:
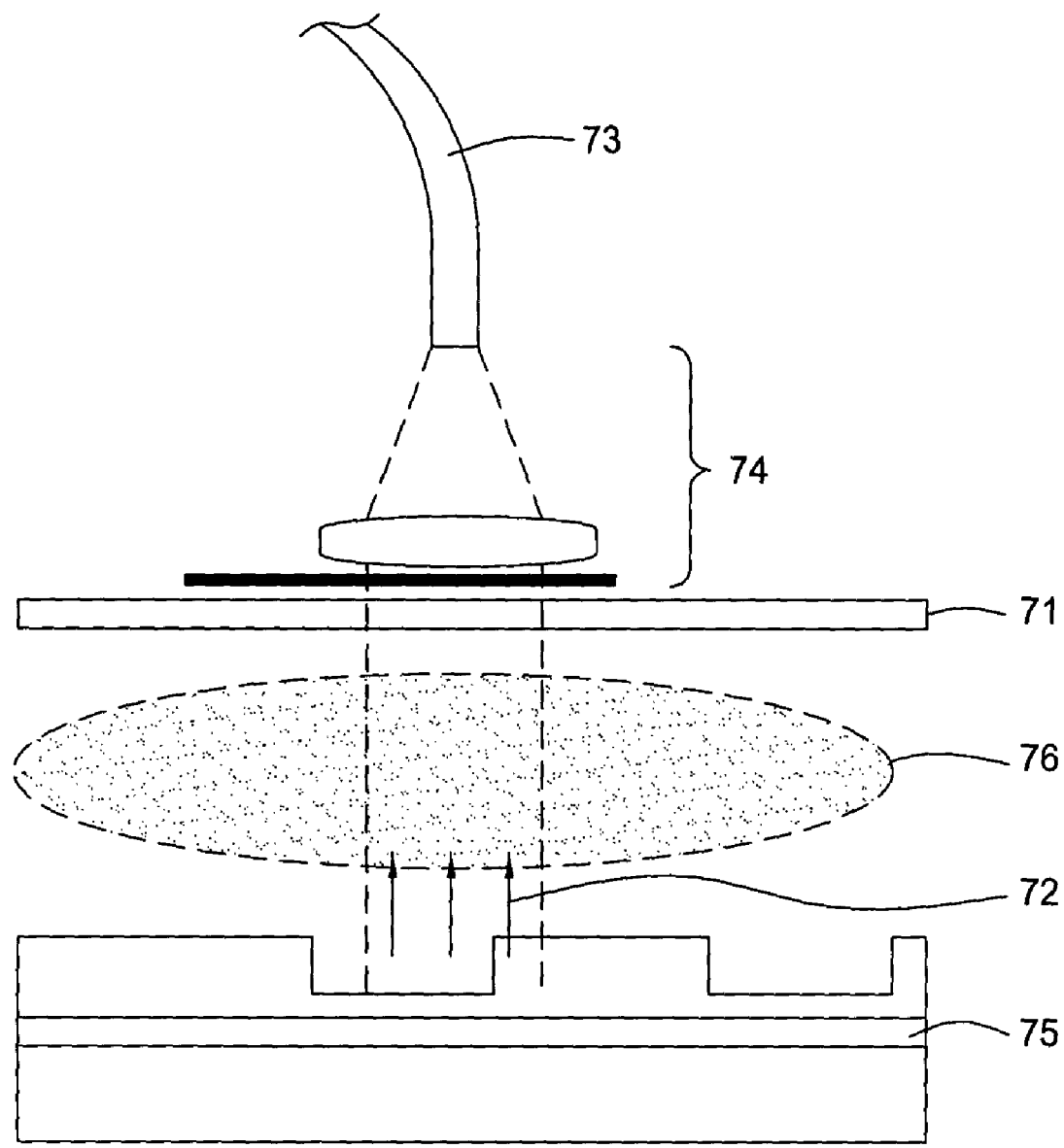
FIG. 1B is a schematic diagram of a process chamber showing a path for reflected light from a wafer inside the process chamber to a light collecting devices.

The interferometric and/or spectrometric measurement assembly may be, for example, configured to perform an interferometric monitoring technique (e.g., counting interference fringes in the time domain, measuring position of the fringes in the frequency domain, and the like) to measure the etch depth profile of the structures being formed on the substrate in real time. Light 72 reflected from a wafer 75 are collected by beam-forming optics 74 and the signals are transmitted by a signal cable 73 to a spectrometer 59. The signals are analyzed by the spectrometer 59 and a processor 60. The analyzed results can be used to generate control commands that control the reactor chamber via controller 61. If the assembly is used to control the endpoint of an etch process, it is called "interferometric endpoint" (IEP). External light from broadband light source 58, e.g., a mercury, deuterium or xenon lamp, could be employed to provide light through fiber optic cable 54 to the wafer. Such a light source may be used in addition to or instead of using the plasma as the light source. Details of film thickness measurement and control (or endpoint) by EyeD™ have been disclosed in commonly assigned U.S. Pat. No. 6,413,867, entitled "Film Thickness Control Using Spectral Interferometry", issued on Jul. 2, 2002, and U.S. application Ser. No. 10/286,402 entitled "Interferometric Endpoint Determination In A Substrate Etching Process", filed Nov. 1, 2002. The assembly may also use one or more non-destructive optical measuring techniques, such as spectroscopy, scatterometry, reflectometry, and the like, to measure the width of structures. As shown in FIG. 1B, light 72 reflected from the wafer 75 surfaces and interfaces passes through a window 71 and is collected by beam-forming optics 74 and signal cable 73. The signals are analyzed by a spectrometer 59 and a processor 60 (FIG. 1A) to determine the width of the structures. Details of how to determine the width of the structures will be described below. The images in FIGS. 1A-1B are not depicted to scale and are simplified for illustrative purposes. To best understand the invention, the reader should simultaneously refer to FIGS. 3A and 3B.

Another EyeD™ chamber module is an optical electromagnetic emission (OES) monitor assembly to monitor the chamber plasma state. The OES monitor can be used to determine the degree of chamber matching and the source(s) of process and/or system fault. OES signals emitted from the plasma 76 are collected by a signal collecting device 55 and the signals are transmitted by a signal cable 56. The signals are analyzed by the spectrometer 59 and the processor 60. The analyzed results can be used to generate control command and be used to control the reactor chamber via controller 61. Details of this application have been disclosed in commonly assigned patent application Ser. No. 10/628,001, entitled "Method For Automatic Determination Of Semiconductor Plasma Chamber Matching And Source Of Fault By Comprehensive Plasma Monitoring", filed on Jul. 25, 2003.

At step 16 of FIG. 1, the sequence 10 queries if all substrates from the batch of such substrates have been processed. If the query of step 16 is negatively answered, the sequence 10 proceeds to step 12. If the query of step 16 is affirmatively answered, the sequence 10 proceeds to step 18. At step 18, the sequence 10 ends.

In one illustrative etch process, the endpoint of a photoresist trimming process is monitored using ex-situ critical dimension (CD) measurement information in combination with in-situ monitoring performed during the trim process. In one embodiment, the in-situ monitoring uses a metric associated with a correlation between a vertical etch rate and a horizontal etch rate of the trimming process. In another embodiment, the in-situ monitoring uses a metric associated with a correlation between a spectral position of a minimum in the spectrum of radiation reflected from the substrate and a width for structures of the patterned mask.

A process system suitable for facilitating the trimming process includes a metrology module for measuring critical dimension (CD) (e.g., widths) of the structures of the patterned mask and an etch reactor for performing the etch process (e.g., trimming process). The etch reactor includes an in-situ module for monitoring a metric associated with the structures being etched (e.g., spectral intensity of the radiation reflected from the substrate or a correlation between the vertical etch rate and the horizontal etch rate).

Figure 2A:
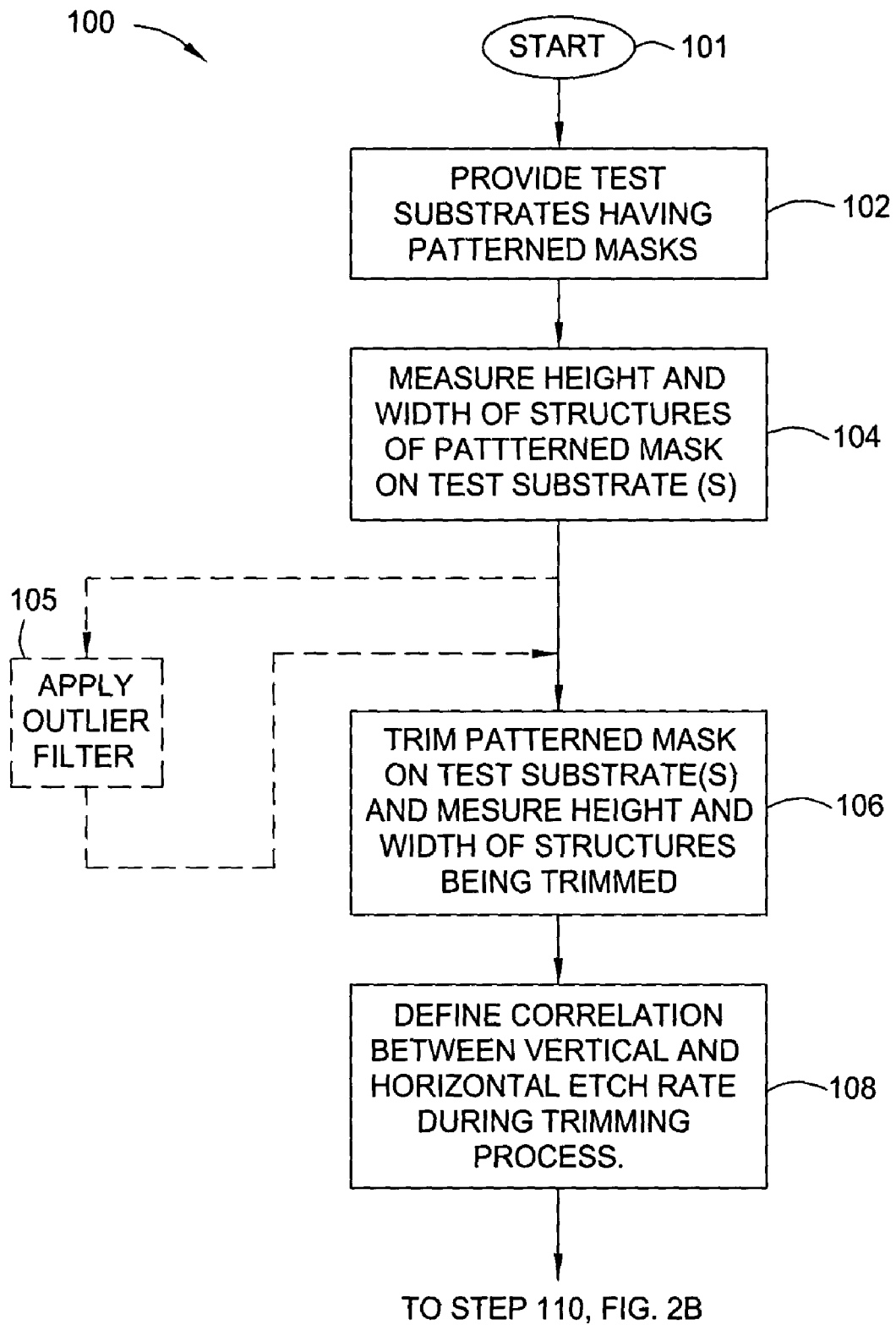
FIGS. 2A-2B depict a flow diagram of a method for monitoring a mask trimming process in accordance with one embodiment of the present invention.
Figure 2B:
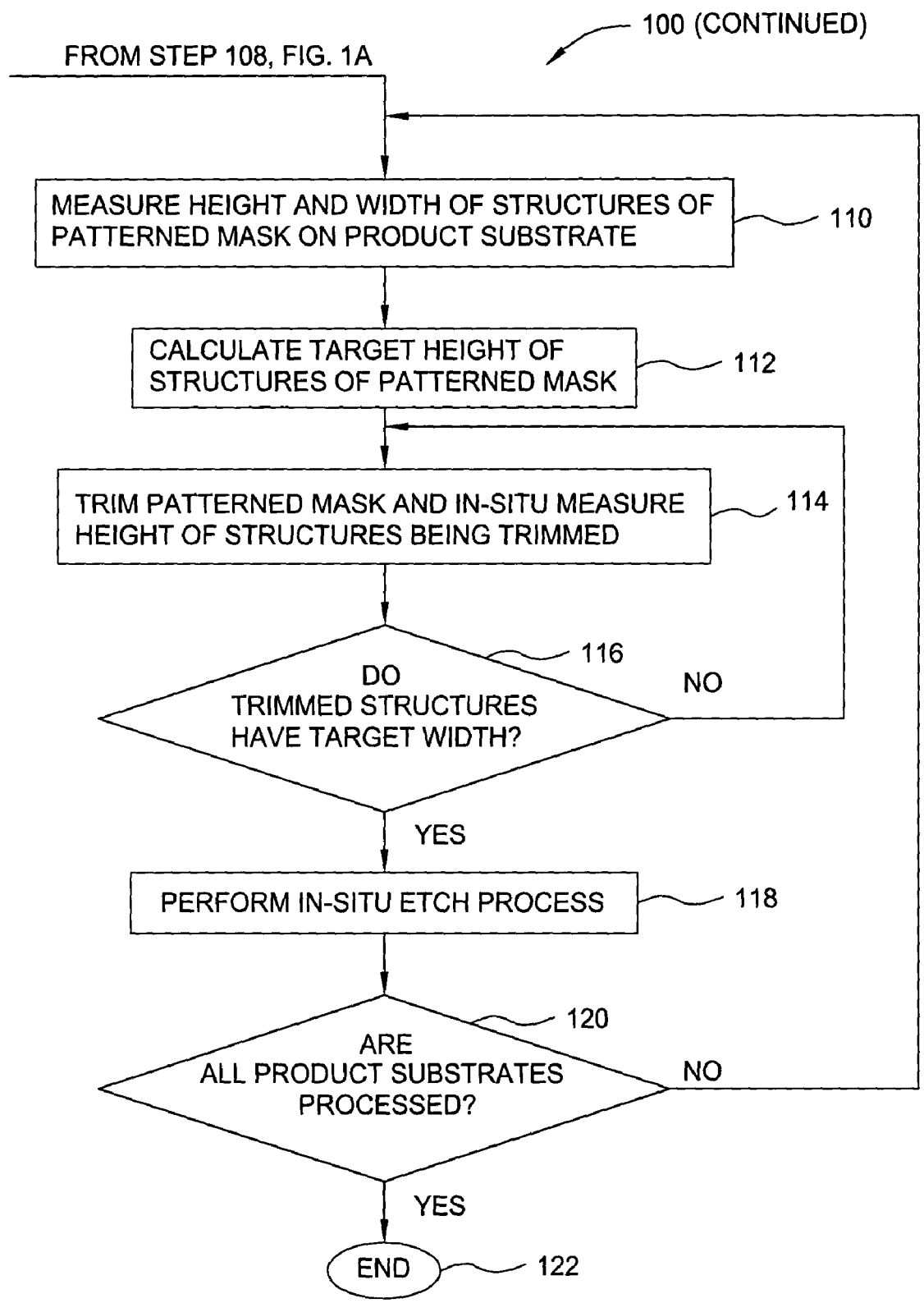

FIGS. 2A-2B depict a flow diagram of one exemplary etch process for monitoring the endpoint of a mask trimming process as a sequence 100. The sequence 100 includes a series of processing steps, which may be performed on test and product substrates.

Figure 3A:
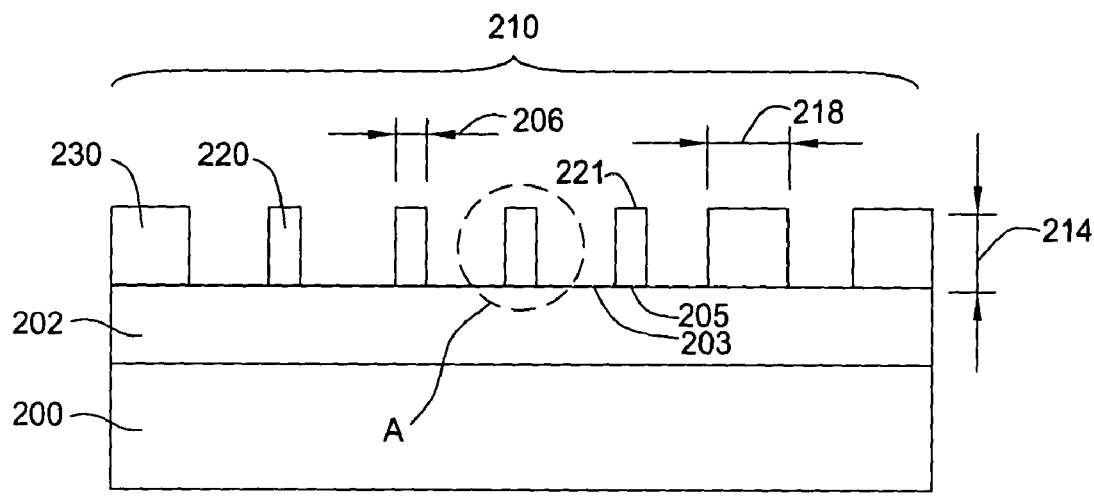
FIGS. 3A-3B depict schematic, cross-sectional views of a substrate having a patterned mask being trimmed.
Figure 3B:
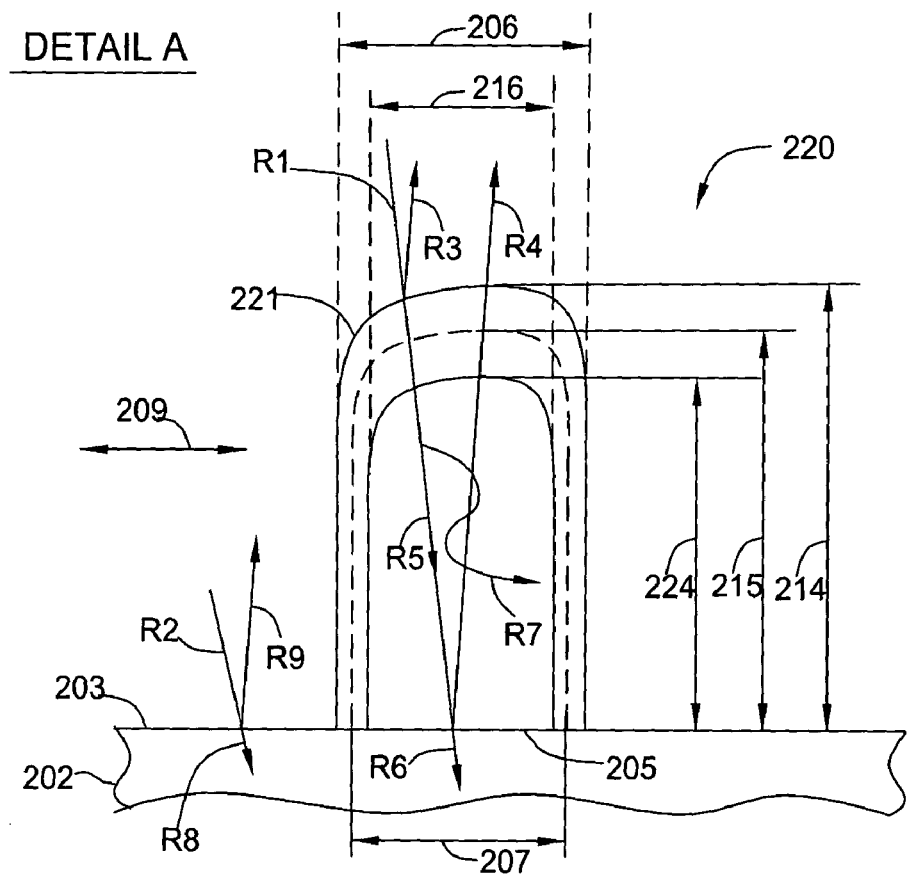

FIGS. 3A-3B depict schematic, cross-sectional views of a substrate having a mask being trimmed using the inventive method. The images in FIGS. 3A-3B are not depicted to scale and are simplified for illustrative purposes. To best understand the invention, the reader should simultaneously refer to FIGS. 2A-2B and FIGS. 3A-3B.

The sequence 100 starts at step 101 and proceeds to step 102. At step 102, a layer 202 and a patterned mask 210 are illustratively formed on a substrate 200 (e.g., silicon wafer) (FIG. 3A). For convenience, herein the same schematic, cross-sectional view and respective reference numerals may relate to either a test or product substrate 200.

The layer 202 may comprise a single material film (e.g., dielectric film, metal film, or any other film used in integrated circuits) or a multi-layered film stack, either unpatterned (as shown) or, alternatively, patterned. During a subsequent etch process, the layer 202 may be etched using the patterned mask 210 as an etch mask. The layer 202 can be formed using any conventional thin film deposition technique, for example, atomic layer deposition (ALD), physical vapor deposition (PVD), chemical vapor deposition (CVD), plasma enhanced CVD (PECVD), and the like that is performed using, e.g., respective processing reactors of CENTURA®, ENDURA®, or other processing systems available from Applied Materials, Inc. of Santa Clara, Calif.

The patterned mask 210 may generally be in a form of a photoresist mask, an α-carbon (i.e., amorphous carbon) mask, a hard mask, an Advanced Patterning Film™ (APF) available from Applied Materials of Santa Clara, Calif., and the like. In one exemplary embodiment, the patterned mask 210 is a photoresist mask. Illustratively, referring to FIG. 3A, the patterned mask 210 has a height 214 and includes structures 220 and 230 (e.g., lines, walls, columns, and the like) having widths 206 and 218, respectively. The width 206 is smaller than the width 218 or a width of any other structure of the patterned mask 210. Structures 220 having the smallest widths (i.e., critical dimensions, or CDs) generally are the most difficult structures to fabricate on the patterned mask.

The photoresist mask 210 may be fabricated using a lithographic process in which a pattern of features of the device to be formed is optically transferred into a layer of photoresist. The photoresist is then developed, unexposed portions of the photoresist are removed, and the remaining photoresist forms the patterned mask 210. When the patterned mask 210 is a photoresist mask, the layer 202 may further comprise an optional anti-reflective coating (ARC). As sizes of structures of the patterned mask are reduced, inaccuracies in a pattern transfer process may arise from optical limitations inherent to the lithographic process, such as light reflection. The ARC enhances the resolution of the lithographic process by controlling reflection of the light used to expose the photoresist. In one exemplary embodiment, the lithographic process forms the structures 220 having smallest widths 206 of about 80 nm to about 120 nm. Processes of forming the patterned mask 210 are described, for example, in commonly assigned U.S. patent application Ser. No. 10/218,244, filed Aug. 12, 2002, which is incorporated herein by reference.

At step 104, the substrate(s) 200 are inspected and topographic dimensions for structures of the patterned mask 210 are measured. In one embodiment, the measured dimensions comprise critical dimensions, i.e., the width 206 of the structures 220, as well as the height 214 of the patterned mask 210. The width 206 and height 214 are generally measured on each test substrate 200 of a batch of the test substrates. Such measurements may be performed using a metrology tool that is ex-situ with respect to the etch reactor. In one exemplary embodiment, such optical measuring tool is the TRANSFORMA™ metrology module of the CENTURA® processing system available from Applied Materials of Santa Clara, Calif. The TRANSFORMA™ metrology module may use one or more non-destructive optical measuring techniques, such as spectroscopy, interferometry, scatterometry, reflectometry, ellipsometry, and the like. The measured parameters include topographic dimensions and profiles of the structures fabricated on substrates, as well as a thickness of either patterned or blanket dielectric and conductive films. Measurements of critical dimensions for the structures 220 are typically performed in a plurality of regions of the substrate 200, such as a statistically significant number of the regions (e.g., 5 to 9 or more regions), and then averaged for such a substrate.

Due to optical limitations of the lithographic process, the photoresist patterned mask 210 typically comprises structures (e.g., structures 220, 230, and the like) which are scaled-up images of the features to be etched in the underlying layer(s), e.g., layer 202. As such, after the lithographic process, the photoresist mask 210 should be trimmed to reduce the widths of such structures before the mask may be used as the etch mask.

At step 105, an outlier filter may be optionally applied to the height and width values such that those data points that are outliers are removed from the data set. Such outliers are caused by poor local wafer surface conditions or defects. If not removed, outliers may result in the substrate processing parameters being incorrectly established.

At step 106, the patterned mask 210 is trimmed to reduce the widths of the structures 220 and 230 to pre-determined values. As illustratively shown in FIG. 3B, step 106 trims the structures 220 to a pre-determined width 216. Simultaneously, step 106 reduces the width of any other structure (i.e., the width 218 of the structure 230) of the patterned mask 210 in the same ratio as the width 206 is reduced. A trimming process is generally an isotropic etch process (e.g., isotropic plasma etch process) having a high lateral etch rate and high selectivity for the material of the patterned mask 210 (e.g., photoresist) over the material of the underlying layer 202. Typically, using the trimming process, widths of the features of the patterned mask 210 (i.e., structures 220, 230, and the like) may reduced in a range of about 35 to 80%. By knowing the width and height of the patterned mask 210, the method establishes a "trim time" during which isotropic etch is performed. The value of the "trim time" establishes the amount of trimming that will occur.

Step 106 may be performed using an etch reactor, e.g., the Decoupled Plasma Source (DPS II) module of the CENTURA® system. The DPS II module (discussed below in reference to FIG. 10) uses an inductive source (i.e., antenna) to produce a high-density plasma.

In one exemplary embodiment, the photoresist mask 210 is trimmed using the DPS II module by providing hydrogen bromide (HBr) at a flow rate of 2 to 200 sccm, oxygen ($O_2$) at a flow rate of 5 to 100 sccm, a HBr:$O_2$ flow ratio ranging from 1:10 to 10:1), argon (Ar) at a flow rate of 10 to 200 sccm, applying power to an inductively coupled antenna between about 200 to 1000 W, applying a cathode bias power between 0 and 300 W, and maintaining a wafer pedestal temperature between 0 and 80 degrees Celsius at a pressure in the process chamber between 2 and 30 mTorr. One illustrative process provides hydrogen bromide (HBr) at a flow rate of 60 sccm, oxygen ($O_2$) at a flow rate of 28 sccm (i.e., a HBr:$O_2$ flow ratio of about 2:1), argon (Ar) at a flow rate of 60 sccm, applies 600 W of power to the inductively coupled antenna, 100 W of cathode bias power and maintains a wafer pedestal temperature of 50 degrees Celsius at a pressure of 4 mTorr.

In one embodiment, the etch reactor further comprises an in-situ metrology tool configured to measure in real time a metric that corresponds to a height of the structures on the substrate being etched (e.g., the height 214 of the structures 220). During the trimming process, the in-situ metrology tool illuminates the substrate 200 using a broadband radiation source to produce radiation (i.e., incident radiation) having wavelengths in ultra-violet and deep ultra-violet ranges, e.g., from about 200 to 800 nm. Generally, such radiation is directed substantially perpendicular to the substrate 200 and illuminates a region having topographic dimensions of less than about 1 mm. More specifically, the in-situ measuring tool illuminates a region of the substrate 200 that is occupied by the structures (i.e., structures 220) having critical dimensions, such as the width 206.

To increase accuracy of the measurements, the intensity of incident radiation may optionally be modulated and/or pulsed, as well as the radiation may optionally be polarized. The frequency of the incident radiation of modulation is about 10 Hz. The incident radiation may be pulsed using a chopper. In one embodiment, results were obtained using the incident radiation linearly polarized in the direction (shown using arrow 209) that is approximately orthogonal to sidewalls of the structures 220. Generally, the in-situ measuring tool may be configured to perform interferometric and/or spectrometric measurements (discussed below in reference to FIG. 10). In one exemplary embodiment, such in-situ measuring tool is the EyeD™, available from Applied Materials, Inc. of Santa Clara, Calif.

The incident radiation (ray R1), when radiated by the in-situ measuring tool to illuminate the structure 220, is partially reflected back (ray R3) from a surface 221 and partially propagates (ray R5) into the structure 220. The ray R5 further partially propagate through a surface 205 beneath the structure into the layer 202 (ray R6) and absorbed therein, partially are trapped in (rays R7) and absorbed by the material of the structure 220 (e.g., photoresist), and partially are reflected back (ray R4). Correspondingly, a portion of the incident radiation (ray R2) illuminating regions 203 near the structures 220 may partially propagate into the layer 202 (ray R8) where they are absorbed, with a portion reflected back (ray R9) from the layer 202.

The sequence 100 uses the in-situ measuring tool configured to perform an interferometric measuring technique (e.g., counting interference fringes in the time domain, measuring position of the fringes in the frequency domain, and the like) to measure the height of the structures 220 of the patterned mask 210. In one specific embodiment, the in-situ measuring tool uses the interference pattern formed by rays R9, R4 and R3 to measure, during the trimming process, to determine a change of the height 215 of the structures 220 with respect to a pre-selected height (e.g., starting height 214) of the structures. In these measurements, a portion of the incident radiation may also be used as the reference radiation. In one embodiment, the interferometric measurements are performed using at least one wavelength in the spectrum of the radiation.

In one exemplary embodiment, the in-situ measuring tool periodically measures in real time an intermediate height (i.e., height 215) of the structures 220 of patterned mask 210 as the trimming process progresses (for example, measurements performed every 100 milliseconds). The trimming process and measurements continue until the intermediate width 207 becomes equal to or smaller than the pre-determined width 216. To increase accuracy when measuring the height 215 and width 207, these measurements may be repeated using several test substrates 200 and then statistically processed (e.g., averaged).

At step 108, a correlation between a vertical etch rate and the horizontal etch rate of the trimming process is defined. Such a correlation is defined using the results of measurements performed during step 106. It has been discovered that, during a trimming process, a horizontal trim (i.e., etch) rate is proportional to the vertical trim rate. As such, any trimming process recipe may be characterized by a related fixed proportion between the horizontal and vertical etch rates. Herein the terms "horizontal trim rate" and "vertical trim rate" relate to a rate of lateral etching the structures of the patterned mask 210 and the rate of decreasing the height of the structures during the trimming process, respectively.

Referring to FIG. 3B, the horizontal trim rate specifically relates to the rate of decreasing the width 206 and the vertical trim rate relates to the rate of decreasing the height 214 of the structures 220. During the trimming process, using the results of in-situ measurements for vertical dimensions (i.e., height 215) of the structures 220 of the patterned mask 210 being trimmed, the width (i.e., width 207) of such structures may be calculated. The sequence 100 uses the correlation between a calculated target height 224 and the pre-determined width 216 of the structures 220 having the pre-trimmed height 214 and starting width 206 for close-loop control of an end point of the trimming process. As such, the structures 220 may be controllably trimmed to the pre-determined width 216.

At step 110, a batch of product substrates each having the patterned mask 210 (e.g., photoresist mask) is provided. Prior to the trimming process, the width 206 and height 214 of the structures 220 are measured on each product substrate. In one exemplary embodiment, these measurements are performed using the same measuring tool (e.g., TRANSFORMA™ metrology module) and same methodology as described above in step 104 with reference to the test substrates.

At step 112, the target height 224 of the structures 220 is calculated for each product substrate using the defined correlation (step 108) between the starting width 206 (measured at step 110) of the structure to be trimmed, vertical trim rate of the trimming process, and the pre-determined (target) width 216 of the trimmed structure.

At step 114, the patterned mask 210 of the product substrate is trimmed using an etch rector comprising the in-situ measuring tool adapted to measure, in real time, the height of the structures of the mask 210. During the trimming process, the in-situ measuring tool in real time measures the intermediate height (i.e., height 215) of the structures 220 of the patterned mask 210 (e.g., photoresist mask) being trimmed and communicates the results of these measurements to a processor (or controller) of the etch reactor. In one exemplary embodiment, the trimming process is performed using the DPS II module comprising the in-situ measuring tool described above in reference to step 106.

At step 116, the sequence 100 queries if the height (i.e., intermediate height 215) of the structures 220 has been trimmed to the target height 224 calculated at step 112 above. If the query of step 116 is negatively answered, the sequence 100 proceeds to step 114 to continue the trimming process and real time in-situ measurements of the intermediate height 215 of the structures 220. If the query of step 116 is affirmatively answered, the sequence 100 proceeds to an optional step 118.

At step 118, the layer 202 may be in-situ etched using the trimmed patterned mask 210 as an etch mask. At step 120, the sequence 100 queries if all product substrates from the batch of such substrates have been processed. If the query of step 120 is negatively answered, the sequence 100 proceeds to step 110. If the query of step 120 is affirmatively answered, the sequence 100 proceeds to step 122. At step 122, the sequence 100 ends.

Figure 4:
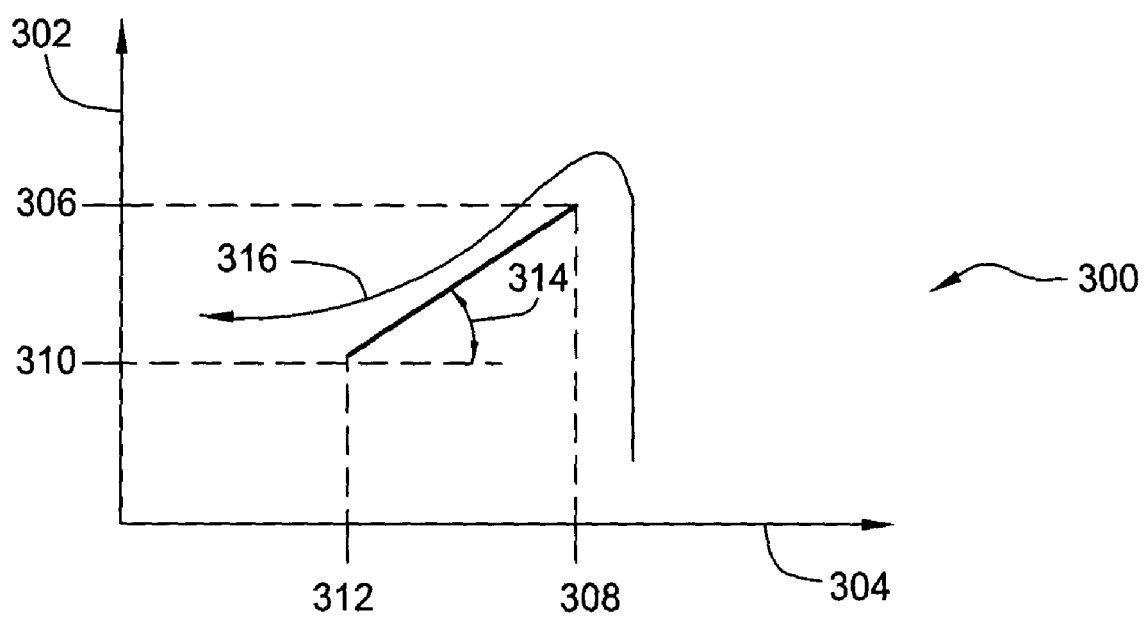
FIG. 4 shows a graph illustrating the correlation between vertical and horizontal etch rates during a mask trimming process.

FIG. 4 depicts a graph 300 illustrating exemplary results of the measurements performed on the test substrate 200 during step 106. More specifically, the graph 300 depicts a width (y-axis 302) of a structure (e.g., structure 220) of the patterned mask 210 versus the height (x-axis 304) of the structure during the trimming process. In the graph 300, an angle 314 corresponds to a ratio between the horizontal and vertical trim rates. The measurements 308 and 306 relate to the width 206 and height 214 of the structure 220 to be trimmed, respectively. Accordingly, the measurements 312 and 310 correspond to the pre-determined width 216 and the target height 224 of the trimmed structure 220. Using the graph 300 (shown for simplicity as a linear graph), at step 108, the target height 224 may be calculated as illustrated using arrow 316.

Figure 5A:
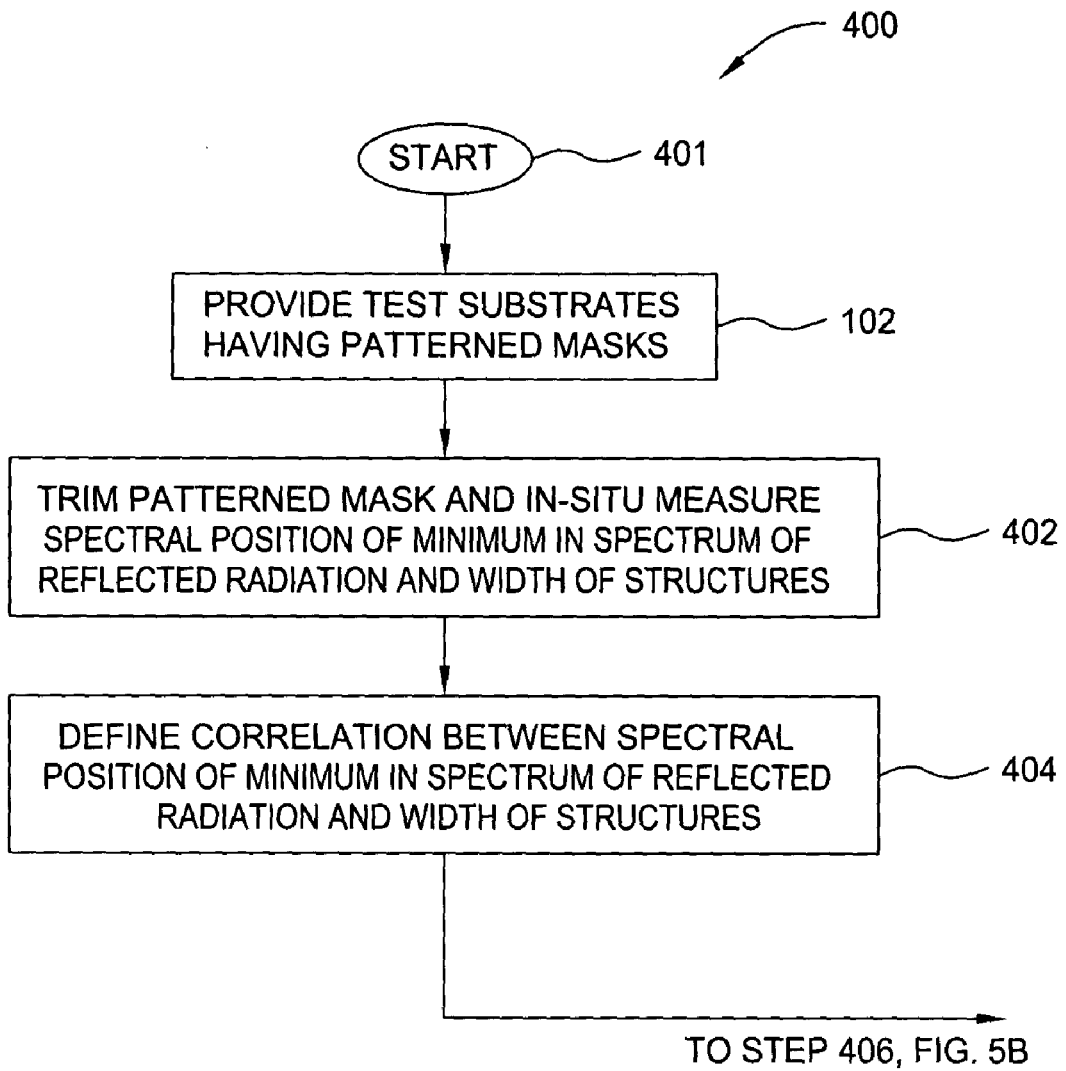
FIGS. 5A-5B depict a flow diagram of a method monitoring a mask trimming process in accordance with another embodiment of the present invention.
Figure 5B:
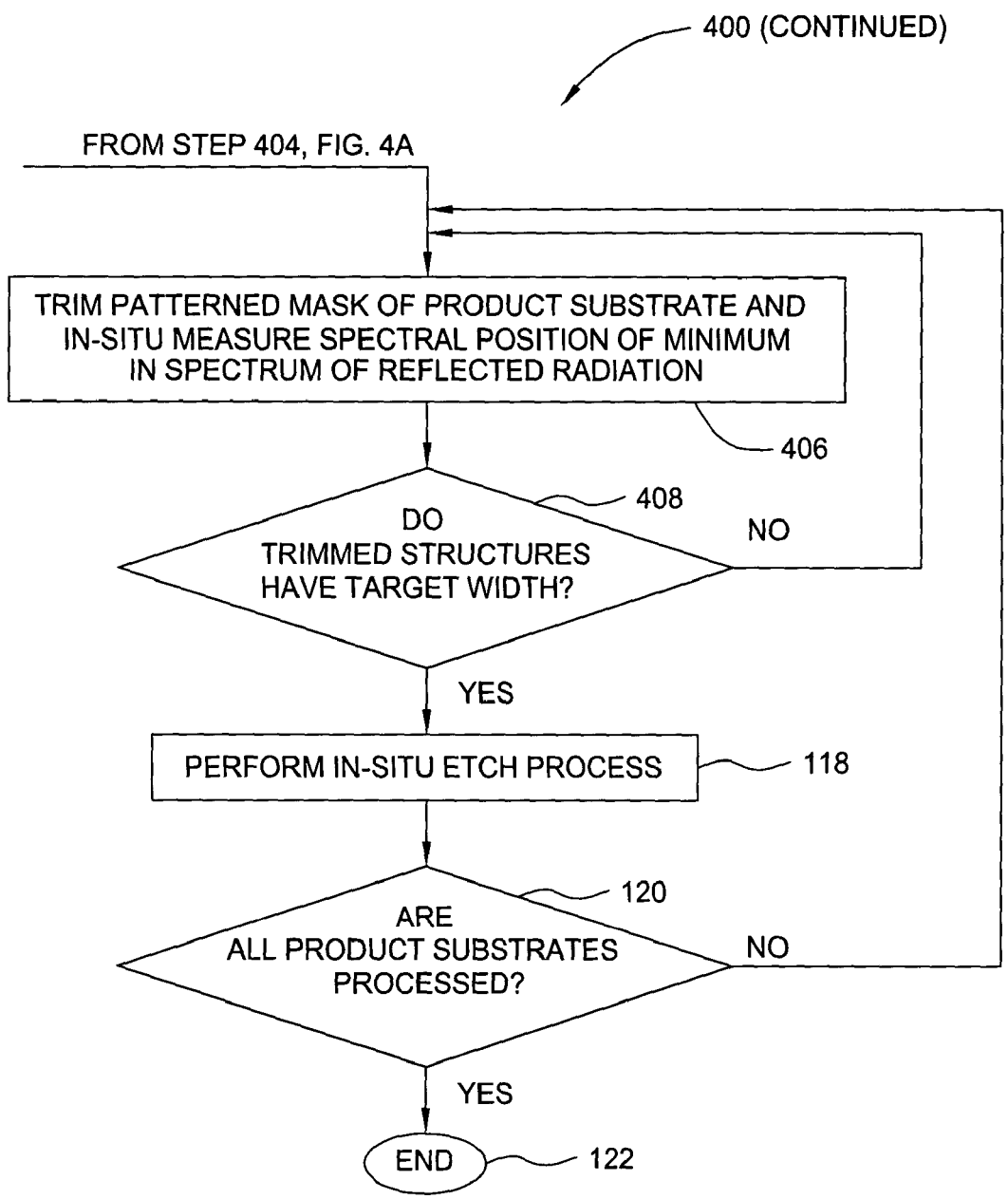

FIGS. 5A-5B depict a flow diagram of another embodiment of the inventive method for endpoint detection of a mask trimming process as sequence 400. The sequence 400 includes a series of processing steps, which are performed on test and product substrates to accomplish the method. In FIGS. 2A-2B and FIGS. 5A-5B, the same reference numerals are used to designate similar processing steps. To best understand the invention, the reader should simultaneously refer to FIGS. 5A-5B and FIGS. 3A-3B.

The sequence 400 starts at step 401, performs step 102, and proceeds to step 402. At step 402, the test substrate 200 is transported to an etch reactor (e.g., the DPS 11 module of the CENTURA® system) comprising the in-situ optical measuring tool described above in reference to step 104 of the sequence 100. The sequence 400 uses the in-situ measuring tool configured to perform spectrometric measurements. Step 402 trims the patterned mask 210 using, e.g., the trimming process described above in reference to step 106, as well as contemporaneously performs measurements of the spectral intensity of a portion of the radiation reflected from the substrate 200. Herein the term "spectral intensity" is used to describe distribution of energy of the radiation in the spectrum of the radiation.

In one embodiment, the in-situ measuring tool performs these measurements using a portion of the radiation that is reflected from the region on the substrate 200 that is occupied by the structures 220. The trimming process is terminated periodically (for example, every 100 milliseconds) for measuring the intermediate width 207 of the structures 220 being trimmed. These measurements may be performed in-situ using, e.g., the EyeD™ metrology module described above in reference to step 104 of the sequence 100.

The spectral intensity of the radiation reflected back from the surfaces 221, 205 and regions 203 (i.e., rays R3, R4, and R9) does not change noticeably during the trimming process. However, the structure 220 selectively traps in and absorbs the radiation (i.e., ray R7) having wavelengths coinciding with the intermediate width 207 of the structure. More specifically, the structure 220 having a width D and formed from material having a coefficient of refraction N, selectively traps in and absorbs the radiation having a wavelength $\lambda_{MIN}$ that is proportional to $\lambda_D$=N×D. It is believed that the trapping of the radiation having the wavelength $\lambda_{MIN}$ in the structure 220 relates to the phenomena of resonance and total internal reflection of the radiation within the structure.

To measure the width of the illuminated structures (e.g., structures 220) of the patterned mask 210, the sequence 400 uses the in-situ measuring tool that is adjusted to perform a spectroscopic measuring technique (i.e., measurements of intensity of the radiation versus a wavelength). In one specific embodiment, during the trimming process, the in-situ measuring tool defines a spectral location $\lambda_{MIN}$ of a minimum in the spectrum of the radiation reflected from the substrate 200 with respect to a pre-selected reference wavelength.

As a result of selective trapping of a portion (ray R7) of the incident radiation, the radiation reflected from the region occupied by the structures 220 (rays R3, R4, and R9) has a low spectral intensity (i.e., a minimum in the spectrum of such reflected radiation) at the wavelength $\lambda_{MIN}$. As the trimming process progresses and the width D of the structure 220 decreases, ever shorter wavelengths are trapped in and absorbed by the structure 220. As such, during the trimming process, the spectral position (i.e., wavelength $\lambda_{MIN}$) of the minimum in the spectrum of the reflected radiation changes in a direction of the shorter wavelengths.

In one embodiment, during the trimming process, the in-situ measuring tool performs real time measurements of the spectral position of the minimum $\lambda_{MIN}$ in the spectrum of the reflected radiation, as well as of the intermediate width 207 of the structures 220. The trimming process and in-situ measurements continue until the intermediate width 207 becomes equal to or smaller than the pre-determined (target) width 216. To increase accuracy of measuring the width 207, these measurements may be repeated using several test substrates 200 and then statistically processed (e.g., averaged).

At step 404, a correlation between the spectral position of the minimum $\lambda_{MIN}$ in the spectrum of reflected radiation and the intermediate width 207 of the structure 220 is defined using the results of measurements performed during step 402. Such a correlation allows calculating in real time the starting width 206, as well as detecting the target width 216 of the structure 220 using the results of the in-situ measurements of the spectral position of the minimum $\lambda_{MIN}$, that are performed during the trimming process.

At step 406, the patterned mask 210 of the product substrate of a batch of such substrates is trimmed using the etch rector comprising the in-situ measuring tool adapted to measure in real time the spectral position of the minimum $\lambda_{MIN}$ in the spectrum of reflected radiation. In one exemplary embodiment, step 406 uses the DPS II module comprising the in-situ measuring tool described above in reference to step 402. The in-situ measuring tool is adjusted to illuminate on the product substrate the region occupied be the structures 220 of the patterned mask 210 (e.g., photoresist mask) being trimmed. During the trimming process, the in-situ measuring tool measures in real time the spectral position of the minimum $\lambda_{MIN}$ and communicates the results of these measurements to a processor (or controller) of the etch reactor.

At step 408, the sequence 400 queries if the width (i.e., intermediate width 207) of the structures 220 has been trimmed to the target width 216 calculated at step 404 above. If the query of step 408 is negatively answered, the sequence 400 proceeds to step 406 to continue the trimming process and real time in-situ measurements of the intermediate width 207 of the structures 220 being trimmed. If the query of step 408 is affirmatively answered, the sequence 400 proceeds to an optional step 118.

At step 118, the layer 202 may be in-situ etched using the trimmed patterned mask 210 as an etch mask. At step 120, the sequence 400 queries if all product substrates from the batch of such substrates have been processed. If the query of step 120 is negatively answered, the sequence 400 proceeds to step 406. If the query of step 120 is affirmatively answered, the sequence 400 proceeds to step 122. At step 122, the sequence 400 ends.

FIGS. 6A-6B depict a series of graphs illustrating an example of changes in spectral intensity of radiation reflected from the substrate 200 during the trimming process. A first graph 510 depicts intensity (y-axis 502) of the incident radiation versus a wavelength (x-axis 504). A second graph 520 depicts changes, during the trimming process, in intensity (y-axis 522) of radiation reflected from the region on the substrate 200 occupied by the structures 220 versus a wavelength (x-axis 514). Referring to FIG. 6B, at moment T1, prior to the beginning of the trimming process, the spectral intensity of the reflected radiation comprises a minimum 518 having a spectral position (i.e., wavelength $\lambda_{MIN}$) 511 that corresponds to the starting width 206 of the structure 220. As the trimming process continues (illustrated using broken lines), at moment T2, the width of the structures 220 decreases to the intermediate width 207 and the spectral position of the minimum 518 changes to the wavelength 513 that is shorter than the wavelength 51. The spectral position of the minimum 518 decreases to the wavelength 515 when, at moment T3, the structure 220 is trimmed to the target width 516.

Figure 7:
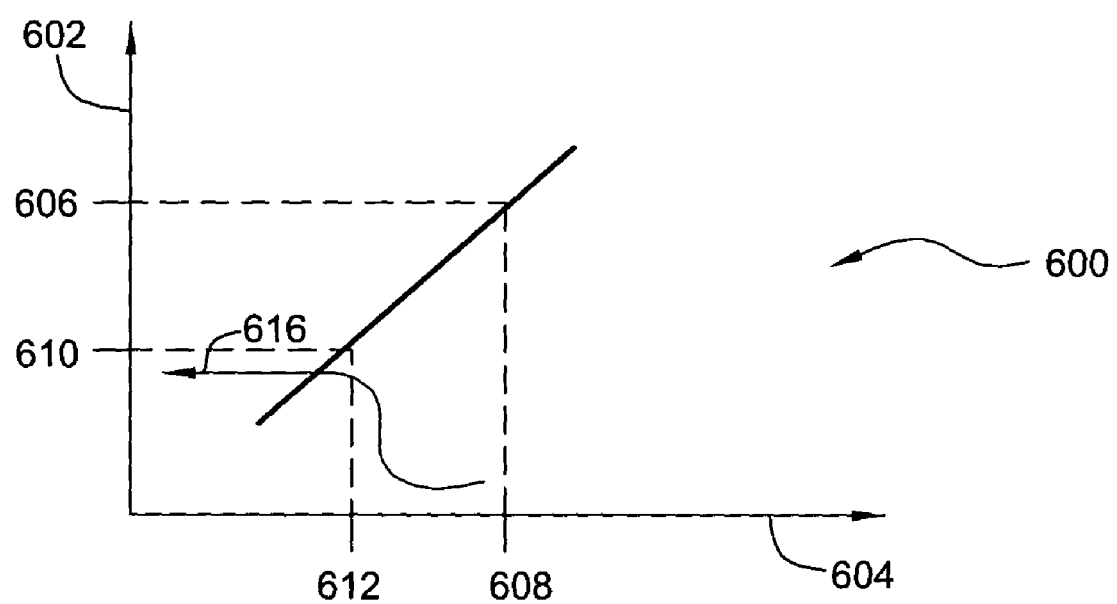
FIG. 7 shows a graph illustrating the correlation between the spectral position of a minimum in the spectrum of reflected radiation and the width of the trimmed patterned mask features.

FIG. 7 depicts a graph 600 illustrating exemplary results of the measurements performed on the test substrate 200 during step 402. More specifically, the graph 600 depicts a width (y-axis 602) of a structure of the patterned mask 210 versus the spectral position (i.e., wavelength $\lambda_{MIN}$) of the minimum in the spectrum of radiation reflected from the region on the substrate 200 occupied by such structures (x-axis 604). In the graph 600, the measurements 608 and 606 relate to the wavelength 511 and the starting width 206 of the structure 220, and the measurements 612 and 610 correspond to the wavelength 515 and the target width 216 of the structure 220, respectively (wavelengths 511 and 515 are discussed in reference to FIG. 5B above). Using the graph 600 (shown for simplicity as a linear graph), at step 408, the target width 216 may be calculated as illustrated using arrow 616.

Figure 8A:
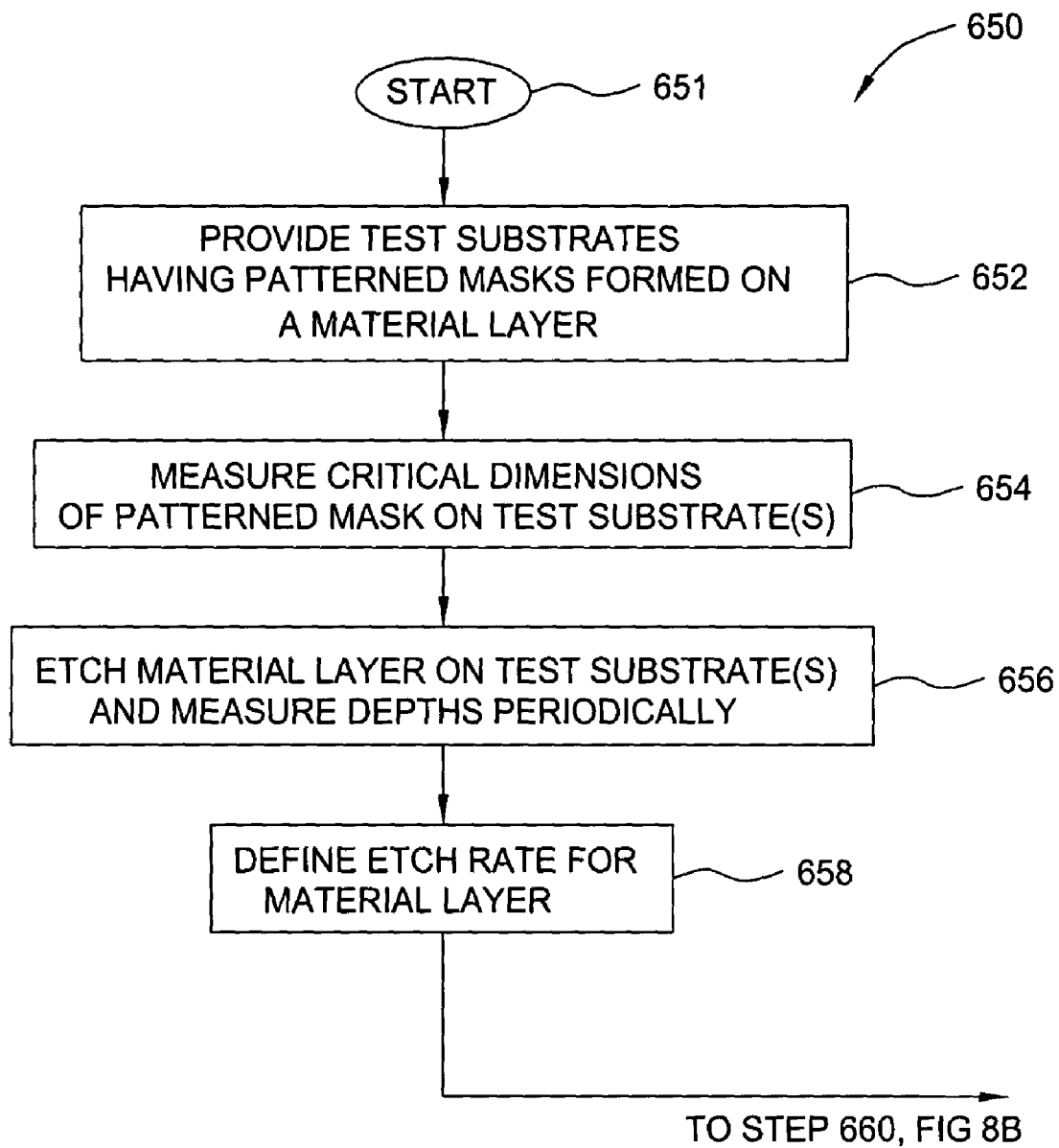
FIGS. 8A-8B depict a flow diagram of a method of monitoring a material layer etch process in accordance with another embodiment of the present invention.
Figure 8B:
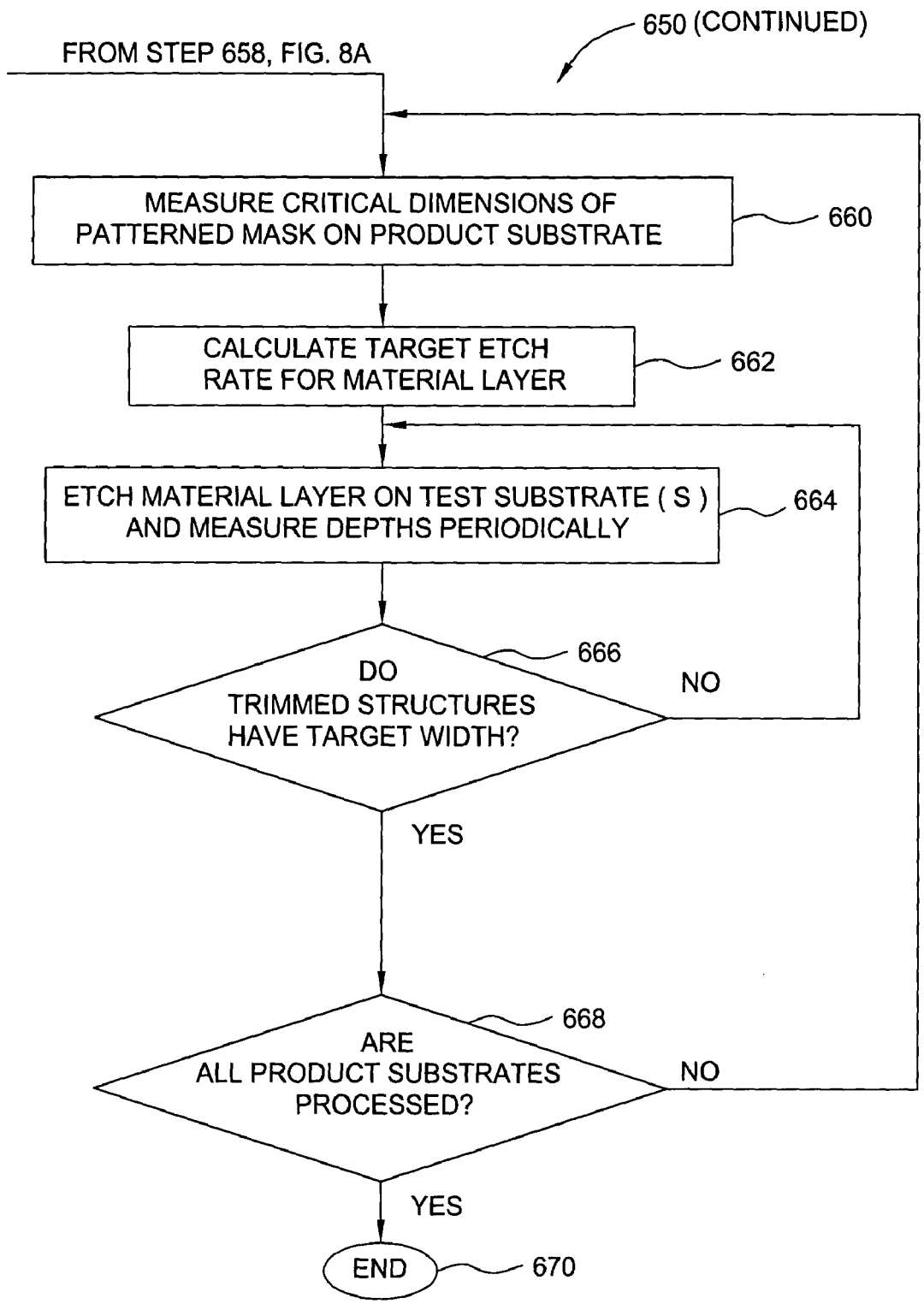

FIGS. 8A-8B depict a flow diagram of one exemplary etch process for monitoring a feature being etched in a material layer as a sequence 650. The sequence 650 includes a series of processing steps, which may be performed on test and product substrates.

Figure 9A:
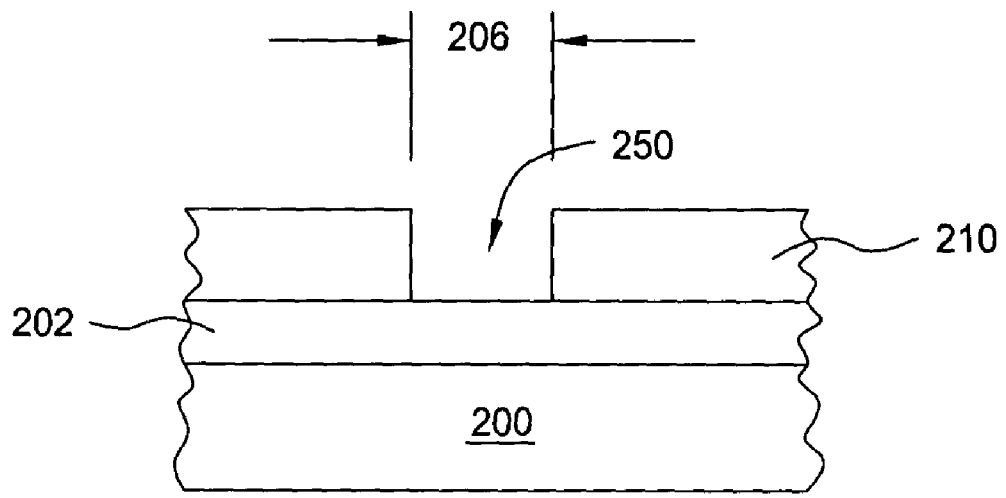
FIGS. 9A-9B depict a series of schematic, cross-sectional views of a substrate having a material layer being etched.
Figure 9B:
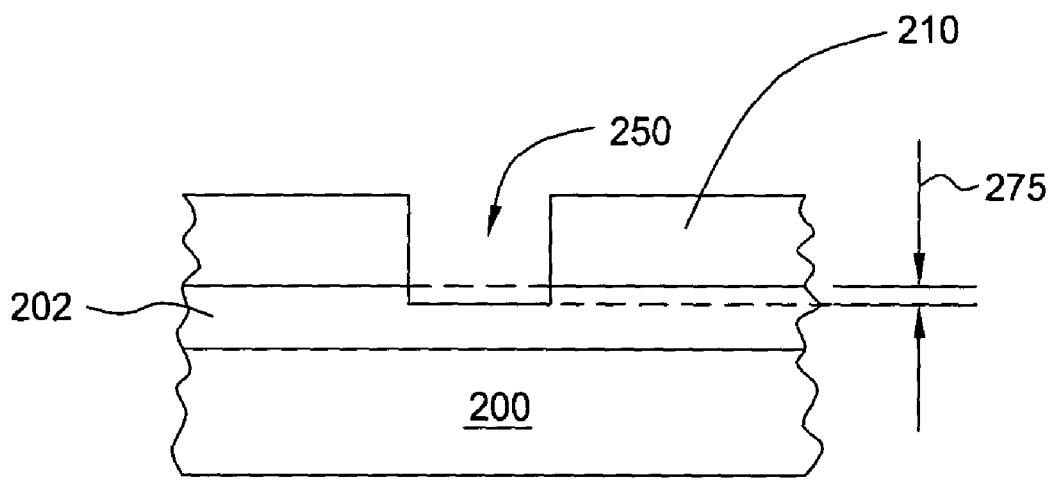

FIGS. 9A-9B depict schematic, cross-sectional views of a substrate having a feature being etched in a material layer using the inventive method. The images in FIGS. 9A-9B are not depicted to scale and are simplified for illustrative purposes. To best understand the invention, the reader should simultaneously refer to FIGS. 8A-8B and FIGS. 9A-9B.

The sequence 650 starts at step 651 and proceeds to step 652. At step 652, a layer 202 and a patterned mask 210 are illustratively formed on a substrate 200 (e.g., silicon wafer) (FIG. 9A). For convenience, herein the same schematic, cross-sectional views and respective reference numerals may relate to either a test or product substrate 200.

The layer 202 may comprise a single material film (e.g., dielectric film, metal film, or any other film used in integrated circuits) or a multi-layered film stack, either unpatterned (as shown) or, alternatively, patterned. During a subsequent etch process, the layer 202 may be etched using the patterned mask 210 as an etch mask. The layer 202 can be formed using any conventional thin film deposition technique, for example, atomic layer deposition (ALD), physical vapor deposition (PVD), chemical vapor deposition (CVD), plasma enhanced CVD (PECVD), and the like that is performed using, e.g., respective processing reactors of CENTURA®, ENDURA®, or other processing systems available from Applied Materials, Inc. of Santa Clara, Calif.

The patterned mask 210 may generally be in a form of a photoresist mask, an α-carbon (i.e., amorphous carbon) mask, a hard mask, an Advanced Patterning Film™ (APF) available from Applied Materials of Santa Clara, Calif., and the like. In one exemplary embodiment, the patterned mask 210 is a photoresist mask. Illustratively, referring to FIG. 9A, the patterned mask 210 has openings defining a structure 250 of a width 206 defined therein.

The photoresist mask 210 may be fabricated using a lithographic process in which a pattern of features of the device to be formed is optically transferred into a layer of photoresist. The photoresist is then developed, unexposed portions of the photoresist are removed, and the remaining photoresist forms the patterned mask 210. When the patterned mask 210 is a photoresist mask, the layer 202 may further comprise an optional anti-reflective coating (ARC). As sizes of structures of the patterned mask are reduced, inaccuracies in a pattern transfer process may arise from optical limitations inherent to the lithographic process, such as light reflection. The ARC enhances the resolution of the lithographic process by controlling reflection of the light used to expose the photoresist. In one exemplary embodiment, the lithographic process forms the structures 220 having smallest widths 206 of about 80 nm to about 120 nm. Processes of forming the patterned mask 210 are described, for example, in commonly assigned U.S. patent application Ser. No. 10/218,244, filed Aug. 12, 2002, which is incorporated herein by reference.

At step 654, the substrate(s) 200 are inspected and topographic dimensions for structures of the patterned mask 210 are measured. In one embodiment, the measured dimensions comprise critical dimensions, i.e., the width 206 of the structures 250 of the patterned mask 210 as well as a thickness for the layer 202 being etched. The width 206 is generally measured on each test substrate 200 of a batch of the test substrates. Such measurements may be performed using a metrology tool that is ex-situ with respect to the etch process. In one exemplary embodiment, such optical measuring tool is the TRANSFORMA™ metrology module of the CENTURA® processing system available from Applied Materials of Santa Clara, Calif. The TRANSFORMA™ metrology module may use one or more non-destructive optical measuring techniques, such as spectroscopy, interferometry, scatterometry, reflectometry, ellipsometry, and the like. The measured parameters include topographic dimensions and profiles of the structures fabricated on substrates, as well as a thickness of either patterned or blanket dielectric and conductive films. Measurements of critical dimensions for the structures 250 are typically performed in a plurality of regions of the substrate 200, such as a statistically significant number of the regions (e.g., 5 to 9 or more regions), and then averaged for such a substrate.

At step 656, the material layer is etched to a pre-determined depth. As illustratively shown in FIG. 9B, step 656 etches the material layer 202 to a pre-determined depth 275. The etching process is generally an anisotropic etch process (e.g., anisotropic plasma etch process) having a high vertical etch rate and high selectivity for the material of the material layer 202 (e.g., silicon oxide) over the material of the mask 210.

Step 656 may be performed using an etch reactor, e.g., the Decoupled Plasma Source (DPS II) module of the CENTURA® system. The DPS II module (discussed below in reference to FIG. 10) uses an inductive source (i.e., antenna) to produce a high-density plasma.

In one exemplary embodiment, the material layer 202 comprising silicon dioxide is etched using the DPS II module by providing carbon tetrafluoride ($CF_4$) at a flow rate of 2 to 200 sccm, argon (Ar) at a flow rate of 10 to 200 sccm, applying power to an inductively coupled antenna between about 200 to 1000 W, applying a cathode bias power between 0 and 300 W, and maintaining a wafer pedestal temperature between 0 and 80 degrees Celsius at a pressure in the process chamber between 2 and 30 mTorr. One illustrative process provides carbon tetrafluoride ($CF_4$) at a flow rate of 60 sccm, argon (Ar) at a flow rate of 60 sccm, applies 600 W of power to the inductively coupled antenna, 100 W of cathode bias power and maintains a wafer pedestal temperature of 50 degrees Celsius at a pressure of 4 mTorr.

In one embodiment, the etch reactor further comprises an in-situ metrology tool configured to measure in real time a metric that corresponds to an etch depth for the material layer being etched (e.g., etch depth 275). During the etch process, the in-situ metrology tool can illuminate the substrate 200 using a broadband radiation source producing the radiation (i.e., incident radiation) having wavelengths in ultra-violet and deep ultra-violet ranges, e.g., from about 200 to 800 nm. Generally, such a radiation is directed substantially perpendicular to the substrate 200 and illuminates a region having topographic dimensions of less than about 1 mm. More specifically, the in-situ measuring tool illuminates a region of the substrate 200 that is occupied by the structures (i.e., structures 250) having critical dimensions, such as the width 206. Details of film thickness measurement and control (or endpoint) by EyeD™ have been disclosed in commonly assigned U.S. Pat. No. 6,413,867, entitled "Film thickness Control Using Spectral Interferometry", issued on Jul. 2, 2002, and U.S. application Ser. No. 10/286,402 entitled "Interferometric Endpoint Determination In A Substrate Etching Process", filed Nov. 1, 2002.

Figure 9C:
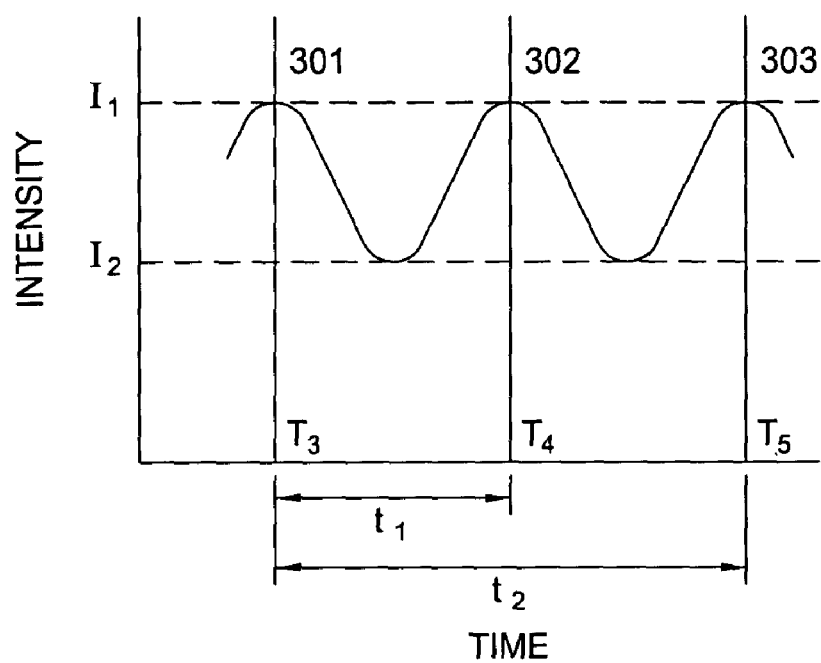
FIG. 9C depicts a graph of an interference fringe intensity versus time during steady intensity period.
Figure 9D:
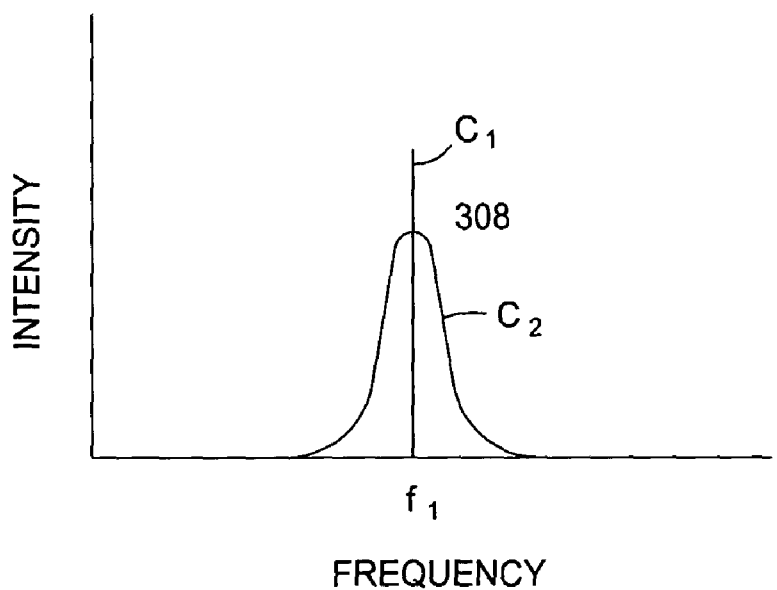
FIG. 9D depicts a graph of an interference fringe intensity versus frequency.

As described in the references mentioned above, etch depth and etching process endpoint can be determined by counting the constructive or destructive interference fringes (intensity maximum or minimum) of reflected light beams from the wafer (or substrate) surface. An example interference fringe trend signal graph is shown in FIG. 9C. The period $t_1$ between peak 301 to peak 302 (or bottom to bottom) equals the period $t_2$ between peak 302 to peak 303. The thickness of material etched during $t_1$ (or $t_2$) equals $\lambda/2$ ($\lambda$ is the wavelength being monitored). The equal periods indicate a steady etch rate and constant peak intensity $I_1$ of peaks 301, 302 and 303 indicates constant signal intensity. The signal between times $T_3$ to $T_4$ shown in FIG. 9C is then processed using a Discrete Fourier Transform (DFT) to convert the intensity versus time graph to a frequency versus time graph. If the intensity versus time graph is sinusoidal, the transformed intensity versus frequency graph will be a vertical line C1 at f1, as shown in FIG. 9D. If the intensity graph of FIG. 9C is not sinusoidal, the transformed graph will be like curve C2 in FIG. 9D with peak of the curve at f1. f1 is the inverse of t1 (1/t1), which is the etch time of half of the monitored wavelength ($\lambda/2$). Since the intensity versus time curve is broad versus time, it's not easy to accurately determine the location of peaks 301 and 302 to determine T3 and T4. Without accurate determination of T3 and T4, t1 (etch time) value cannot be accurately calculated. In contrast, the Discrete Fourier Transformed intensity versus time curve is narrower and can produce much more accurate peak 308 of the graph to accurately determine f1, which is the inverse of t1 (1/t1). Since period $t_1$ equals period $t_2$, a time duration selected from time $T_3$ to time $T_5$ (beyond $T_4$) would still yield only one peak frequency $f_1$.

However, in many cases, the interference trend signal graph is not as ideal as that shown in FIG. 9C. An example of a non-ideal graph of interference fringe intensity versus time is shown as FIG. 9E. The period $t_7$ between peak 304 to peak 305 is greater than the period $t_8$ between peaks 305 and 306. The decreasing periods indicate an increase in etch rate, possibly due to etch loading effect. The peak intensities $I_3$, $I_4$, $I_5$ and $I_6$ of peaks 304, 305, 306 and 307 also decrease with etch time, which indicates decreasing reflected signals with time. The increasing etch rate with time, in accompanying decreasing signals, could be observed during contact, via and trench etch. FIG. 9F shows a DFT processed portion of the graph of FIG. 9E between times $T_{10}$ and $T_{11}$. Since the period $t_6$ between $T_{10}$ and $T_{11}$ is shorter than the full intensity cycle (peak to peak), the DFT did not yield a frequency maximum, as seen in FIG. 9D. If the DFT is performed on the signal between times $T_{10}$ and $T_{12}$, the resulting intensity versus frequency graph yields a maximum $f_2$ (1/t7) that provides an accurate measure of period $t_7$. However, if a DFT is performed on the signal between times $T_{10}$ and $T_{13}$, the resulting intensity versus frequency graph does not yield a singular maximum, but a combined result of dual curves with dual peaks as shown in FIG. 9H. Thus, it's important to select the appropriate time window over which to perform the DFT. For the intensity curves shown in FIG. 9E, it becomes important to use an adaptive time window size within which to perform the DFT to accurately determine etch time. For processes with increasing etch rate, the time window for the DFT needs to decrease with time. Similarly, for processes with decreasing etch rate, the time window for the DFT needs to increase with time.

In one exemplary embodiment, the in-situ measuring tool periodically measures in real time an intermediate etch depth (i.e., etch depth 265) of the structures 250 being etched in material layer 202 during the etch process (for example, measurements every 100 milliseconds). The etch process and measurements continue until the intermediate depth equals the pre-determined depth 275.

At step 658, a vertical etch rate for the etch process is defined. Such an etch rate is defined using the results of measurements performed during step 656. Etch depth and etch rate may be measured by tracking reflectance fringes of a particular wavelength (λ) in a time series. For example, the etch depth equals half of the wavelength (λ/2) when the reflectance pattern reaches a wave cycle. The etch rate can be calculated by dividing the etch depth by the duration.

At step 660, a batch of product substrates each having the patterned mask 210 (e.g., photoresist mask) is provided. Prior to the etch process, the width 206 and layer 202 thickness are measured on each product substrate. In one exemplary embodiment, these measurements are performed using the same measuring tool (e.g., TRANSFORMA™ metrology module) and same methodology as described above in step 654 with reference to the test substrates.

At step 662, the target etch rate of the structures 250 is calculated for each product substrate using the defined correlation (step 108) between the starting width 206 (measured at step 660) of the structure to be etched, vertical etch rate of the etching process, and the pre-determined (target) etch depth 275 of the etched structure.

At step 664, the structures 250 are formed in the material layer 202 of the product substrate using an etch rector comprising the in-situ measuring tool adapted to measure in real time the etch depth profile of the structures 250. During the etch process, the in-situ measuring tool in real time measures the intermediate depth (i.e., height 275) of the structures 250 being etched and communicates the results of these measurements to a processor (or controller) of the etch reactor. In one exemplary embodiment, the etch process is performed using the DPS II module comprising the in-situ measuring tool described above in reference to step 656.

At step 666, the sequence 650 queries if the etch depth (i.e., intermediate depth 265) of the structures 250 has been etched to the target depth 275 calculated at step 662 above. If the query of step 666 is negatively answered, the sequence 650 proceeds to step 664 to continue the etching process and real time in-situ measurements of the intermediate height 275 of the structures 250. If the query of step 666 is affirmatively answered, the sequence 650 proceeds to step 668.

At step 668, the sequence 650 queries if all product substrates from the batch of such substrates have been processed. If the query of step 668 is negatively answered, the sequence 650 proceeds to step 660. If the query of step 668 is affirmatively answered, the sequence 650 proceeds to step 670. At step 670, the sequence 650 ends.

Figure 10:
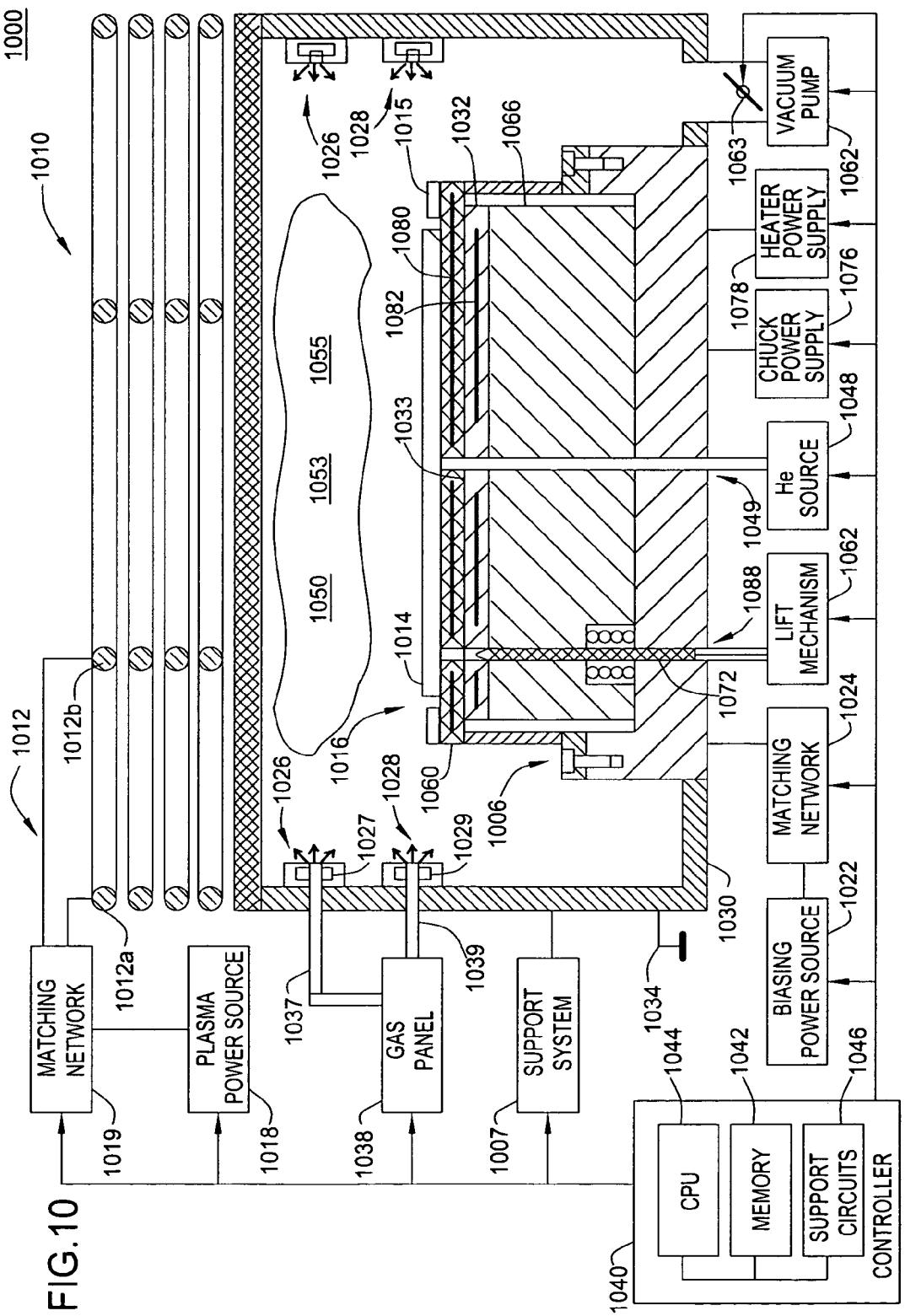
FIG. 10 depicts a schematic view of an exemplary etch reactor including an in-situ monitoring module of the kind used in performing portions of the invention.

FIG. 10 depicts a schematic diagram of an exemplary Decoupled Plasma Source (DPS) II etch reactor 1000 that may illustratively be used to practice the invention. The DPS II reactor 1000 is a processing module of a CENTURA® integrated semiconductor wafer processing system available from Applied Materials, Inc. of Santa Clara, Calif. The particular embodiment of the reactor 1000 shown herein is provided for illustrative purposes and should not be used to limit the scope of the invention.

The reactor 1000 generally comprises a process chamber 1010 having a substrate pedestal 1016 within a conductive body (wall) 1030, and a controller 1040.

The chamber 1010 is supplied with a substantially flat dielectric ceiling 1020. Other modifications of the chamber 1010 may have other types of ceilings, e.g., a dome-shaped ceiling. Above the ceiling 1020 is disposed an antenna 1012 comprising one ore more inductive coil elements (two co-axial elements 1012a and 1012b are shown) that may be selectively controlled. The antenna 1012 is coupled, through a first matching network 1019, to a plasma power source 1018. The plasma power source 1018 typically is capable of producing up to 3000 W at a tunable frequency in a range from 50 kHz to 13.56 MHz.

The substrate pedestal (cathode) 1016 is coupled, through a second matching network 1024, to a biasing power source 1022. The biasing source 1022 generally is a source of up to 500 W at a frequency of approximately 13.56 MHz that is capable of producing either continuous or pulsed power. In other embodiments, the source 1022 may be a DC or pulsed DC source.

A controller 1040 comprises a central processing unit (CPU) 1044, a memory 1042, and support circuits 1046 for the CPU 1044 and facilitates control of the components of the process chamber 1010 and, as such, of the etch process, as discussed below in further detail.

An etchant gas and a passivation gas are provided to the process chamber 1010 from a gas panel 1038. The etchant gas is typically supplied through one ore more inlets 1026 (two inlets are shown) located above the substrate pedestal 1016. The passivation gas is supplied from the gas panel 1038 through a plurality of inlets 1028 (e.g., openings, injectors, and the like). The inlets 1028 (two inlets are shown) are generally located substantially equidistantly around the substrate pedestal 1016 approximately coplanar with a semiconductor wafer 1014 being etched. Embodiment and location of the inlets 1028 are selected to provide high controlled concentration of the passivation gas in a peripheral region (i.e., annular region near the edge) of the wafer 1014.

The etchant gas and the passivation gas are delivered to the process chamber 1010 using separate gas conduits (conduits 1037 and 1039, respectively) and do not mix until they are dispersed into a reaction volume 1053 of the chamber. In the depicted embodiment, the etchant gas is provided to the inlets 1026 using an annular gas channel 1027 and, similarly, the passivation gas is provided to the inlets 1028 using an annular gas channel 1029. The gas channels 1027 and 1029 may be formed in the wall 1030 or in gas rings (as shown) that are coupled to the wall 1030. In the process chamber 1010, the etchant and passivation gases form a gaseous mixture 1050. During an etch process, the gaseous mixture 1050 is ignited into a plasma 1055 by applying power from the plasma source 1018 to the antenna 1012.

The gas pressure in the chamber 1010 is controlled using a throttle valve 1063 and a vacuum pump 1036. The temperature of the wall 1030 may be controlled using liquid-containing conduits (not shown) that run through the wall 1030. Typically, the chamber wall 1030 is formed from a metal (e.g., aluminum (Al), stainless steel, and the like) and coupled to an electrical ground 1034.

In operation, the temperature of the wafer 1014 is controlled by stabilizing a temperature of the substrate pedestal 1016. In one embodiment, a backside gas (e.g., helium (He)) from a gas source 1048 is provided via a gas conduit 1049 to channels that are formed in the pedestal surface under the wafer 1014. The backside gas is used to facilitate heat transfer between the pedestal 1016 and the wafer 1014. During the processing, the pedestal 1016 may be heated by an embedded resistive heater 1032 to a steady-state temperature and then the helium gas facilitates uniform heating of the wafer 1014. Using such thermal control, the wafer 1014 may be maintained at a temperature between about 0 and 350 degrees Celsius.

In one embodiment, the substrate pedestal 1016 comprises an electrostatic chuck 1060, an edge ring 1015, the resistive heater 1032, a heat sink 1066, and a mounting assembly 1006. The electrostatic chuck 1060 comprises at least one clamping electrode 1080 and is controlled by a chuck power supply 1076. The resistive heater 1032 generally comprises at least one heating element 1082 and is regulated by a heater power supply 1078. In alternative embodiments, the substrate pedestal 1016 may comprise a susceptor clamp ring, a mechanical chuck, and the like substrate retention mechanism.

In operation, the lift mechanism 1062 is used to raise the wafer 1014 off the substrate support 1016 or to lower the substrate onto the substrate support. Generally, the lift mechanism 1062 comprises a plurality of lift pins 1072 (one lift pin is shown) that travel through respective guide holes 1088. The process chamber 1010 also comprises conventional systems for process control, internal diagnostic, end point detection, and the like. Such systems are collectively shown as support systems 1007.

Those skilled in the art will understand that other forms of etch chambers may be used to practice the invention, including chambers with remote plasma sources, electron cyclotron resonance (ECR) plasma chambers, and the like.

To facilitate control of the process chamber 1010, the controller 1040 may be one of any form of general-purpose computer processor that can be used in an industrial setting for controlling various chambers and sub-processors. The memory, or computer-readable medium, 1042 of the CPU 1044 may be one or more of readily available memory such as random access memory (RAM), read only memory (ROM), floppy disk, hard disk, or any other form of digital storage, local or remote. The support circuits 1046 are coupled to the CPU 1044 for supporting the processor in a conventional manner. These circuits include cache, power supplies, clock circuits, input/output circuitry and subsystems, and the like. The inventive method is generally stored in the memory 1042 as a software routine. Alternatively, such software routine may also be stored and/or executed by a second CPU (not shown) that is remotely located from the hardware being controlled by the CPU 1044.

Figure 11:
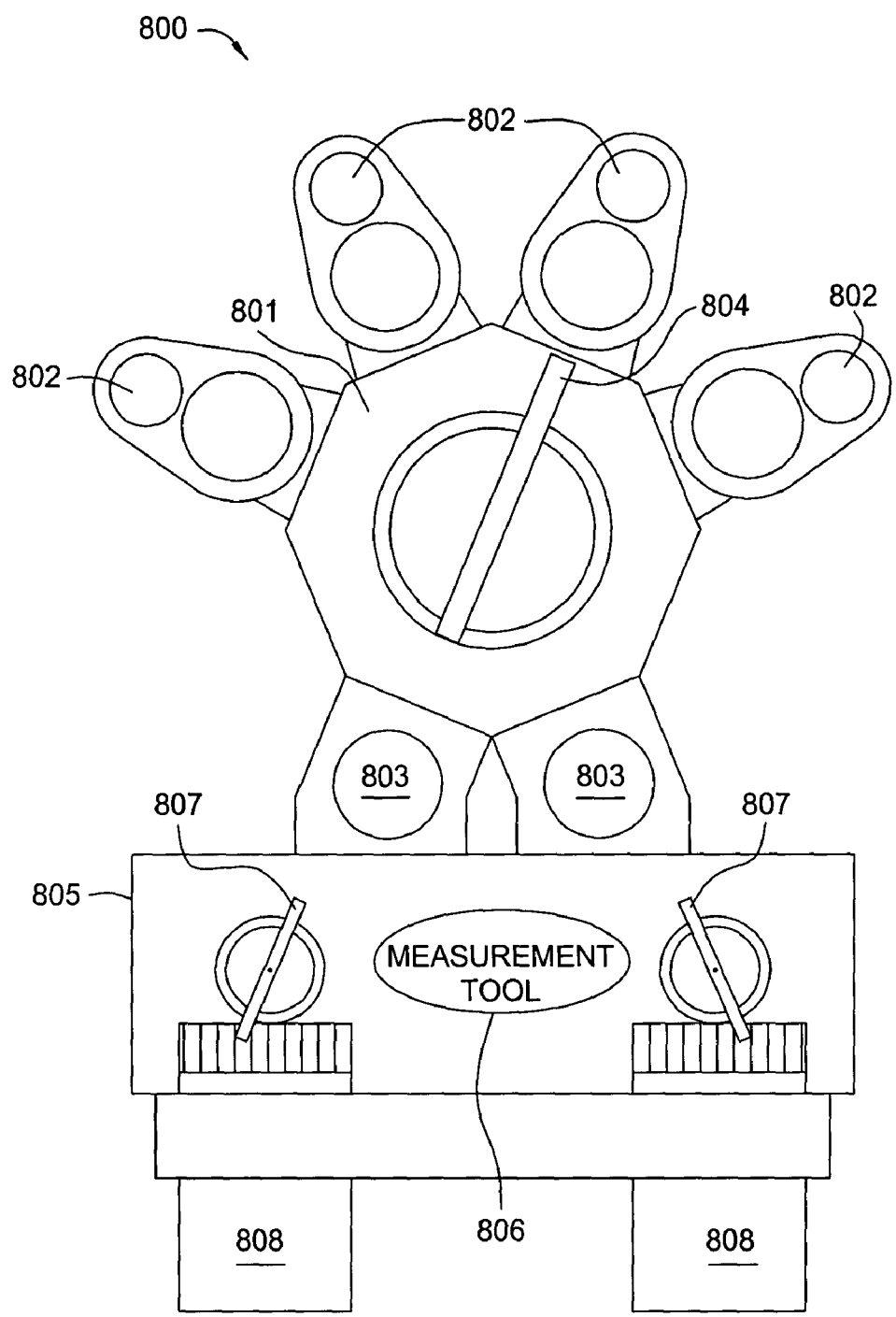
FIG. 11 depicts a schematic diagram of an exemplary process system of the kind used in performing portions of the invention.

An example of an etch system that is integrated with an ex-situ metrology tool with the capability of measuring CDs and film thickness is Applied Materials' Transforma system 800 (FIG. 11). Detailed information describing Applied Materials' Transforma system has been disclosed in a commonly assigned U.S. patent application Ser. No. 10/428,145, titled "Method and Apparatus for Controlling Etch Processes During Fabrication of Semiconductor Devices", filed on May 1, 2003. The system comprises a chamber or "mainframe" 801, such as the Centura™ processing system for mounting a plurality of processing chambers 802, e.g., conventional etch reactors, such as DPSII™ silicon etch chambers and one or more transfer chambers 803, also called "load locks". In one embodiment of the present invention, four etch processing chambers 802 are mounted to the mainframe 801. In one exemplary embodiment, three etch processing chambers 802 are used for etching and one is optionally used for post-etch cleaning (i.e. removing photoresist polymers and other residue from wafers after etching). A robot 804 is provided within the mainframe 801 for transferring wafers between the processing chambers 802 and the transfer chambers 803. The transfer chambers 803 are connected to a factory interface 805, also known as a "mini environment", which maintains a controlled environment. A metrology (or measurement) tool 806 could be integrated in the load lock area 805 and with high-speed data collection and analysis capabilities, every wafer that enters the system 800 can be measured for thickness before and after etch processing. The metrology tool 806 could also be placed at different location within the process system 800. One or more of the process chambers 802 could also be deposition chambers, since the concept of the invention also applies to deposition process.

The invention may be practiced using other etch processes wherein parameters may be adjusted to achieve acceptable characteristics by those skilled in the arts by utilizing the teachings disclosed herein without departing from the spirit of the invention.

The invention may be practiced using other semiconductor wafer processing systems wherein the processing parameters may be adjusted to achieve acceptable characteristics by those skilled in the arts by utilizing the teachings disclosed herein without departing from the spirit of the invention.

Although the forgoing discussion referred to endpoint detection during trimming patterned masks, fabrication of the other devices and structures used in the integrated circuits can benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A method for monitoring an etch process, comprising:
   (a) performing pre-etch critical dimension (CD) measurements of a substrate to generate pre-etch measurement information;
   (b) applying an outlier filter to remove outliers in the pre-etch measurement information;

(c) analyzing the pre-etch measurement information to determine that a patterning is of a sufficient quality to allow for etching of the substrate and to determine process parameters to an etch process;

(d) providing the substrate along with the pre-etch measurement information to an etch reactor;

(e) etching the substrate in the etch reactor to form structures in the substrate using the etch process, wherein the pre-etch measurement information in combination with etch process monitoring are used to in-situ monitor an etch process endpoint, wherein the etch process monitoring comprises:

directing radiation onto the substrate, wherein an intensity of the radiation is modulated at a frequency of about 10 Hz; and collecting a portion of the radiation reflected from the substrate to determine critical dimension of the structures formed in the substrate; and (f) terminating the etch process based on the etch process monitoring having identified that the etch process has reached the etch process endpoint.

2. The method of claim 1 wherein the etch process monitoring of step (f) further comprises achieving a pre-determined etch depth for the etch process.

3. The method of claim 1 wherein the etch process monitoring of step (f) further comprises achieving pre-determined feature dimensions for structures formed during the etch process.

4. The method of claim 1 wherein the pre-etch measurement information is obtained using optical metrology.

5. The method of claim 4 wherein the optical metrology comprises one or more techniques selected from the group consisting of interferometry, scatterometry, reflectometry and ellipsometry.

6. The method of claim 1 wherein the etch process monitoring is performed using optical metrology.

7. The method of claim 6 wherein the optical metrology comprises one or more techniques selected from the group consisting of interferometry, scatterometry and reflectometry.

8. The method of claim 1 wherein the etch process monitoring further comprises:

using a correlation between a vertical etch rate and a horizontal etch rate.

9. The method of claim 1 wherein the etch process monitoring further comprises:

using an interferometric measuring technique to measure a thickness of a layer.

10. The method of claim 9 wherein the radiation is directed substantially perpendicular to the substrate.

11. The method of claim 9 wherein the spectrum of the radiation directed onto the substrate comprises wavelengths in a range from about 200 to 800 nm.

12. The method of claim 1 wherein the etch process monitoring further comprises:

measuring an intensity of wavelengths in a spectrum of the radiation reflected from the substrate.

13. The method of claim 12 wherein the etch process monitoring further comprises:

using a correlation between a spectral position of a minimum in the spectrum and a width of structures formed on the substrate.

14. The method of claim 1 wherein the pre-etch measurements are provided by one of a metrology module coupled to a process system including the etch reactor and a metrology module removed from said process system.

15. A method for monitoring an endpoint of a mask trimming process, comprising:

(a) performing pre-etch critical dimension measurements of a substrate having a mask thereon to generate pre-etch critical dimension measurement information of such mask;

(b) applying an outlier filter to remove outliers in the pre-etch critical dimension measurement information;

(c) analyzing the pre-etch critical dimension measurement information to determine that the mask is of a sufficient quality to allow for etching of the substrate and to determine process parameters to an etch process;

(d) providing the substrate along with the pre-etch critical dimension measurement information to an etch reactor;

(e) trimming the mask using the etch process, wherein the pre-etch critical dimension measurement information in combination with etch process monitoring are used to in-situ monitor the trimming the mask, wherein the etch process monitoring comprises:

directing radiation onto the substrate, wherein an intensity of the radiation is modulated at a frequency of about 10 Hz; and collecting a portion of the radiation reflected from the substrate; and (f) terminating the trim process when the etch process monitoring indicates that the mask has been trimmed to pre-determined dimensions.

16. The method of claim 15 wherein the mask is a photoresist patterned mask.

17. The method of claim 15 wherein the mask is trimmed using a plasma process.

18. The method of claim 15 wherein the pre-etch measurement information is obtained using optical metrology.

19. The method of claim 18 wherein the optical metrology comprises one or more techniques selected from the group consisting of interferometry, scatterometry, reflectometry and ellipsometry.

20. The method of claim 15 wherein the etch process monitoring is performed using optical metrology.

21. The method of claim 20 wherein the optical metrology comprises one or more techniques selected from the group consisting of interferometry, scatterometry and reflectometry.

22. The method of claim 15 wherein the etch process monitoring further comprises:

using a correlation between a vertical etch rate and a horizontal etch rate.

23. The method of claim 15 wherein the etch process monitoring further comprises:

using an interferometric measuring technique to measure a thickness of a layer.

24. The method of claim 23 wherein the radiation is directed substantially perpendicular to the substrate.

25. The method of claim 23 wherein a spectrum of the radiation directed onto the substrate comprises wavelengths in a range from about 200 to 800 nm.

26. The method of claim 15 wherein the etch process monitoring further comprises:

measuring an intensity of wavelengths in a spectrum of the radiation reflected from the substrate.

27. The method of claim 26 wherein the etch process monitoring further comprises:

using a correlation between a spectral position of a minimum in the spectrum and a width of the structures formed on the substrate.

28. A method for monitoring an endpoint of a mask trimming process, comprising:

(a) performing pre-etch measurements of a substrate having a patterned mask thereon to generate pre-etch measurement information of such mask, wherein the pre-etch measurements include width of structures comprising the patterned mask;
(b) applying an outlier filter to remove width outliers in the pre-etch measurement information;
(c) providing the substrate along with the filtered pre-etch measurement information to an etch reactor;
(d) determining process parameters of an etch process in response to the pre-etch measurement information;
(e) trimming the mask using the etch process, wherein the filtered pre-etch measurement information in combination with etch process monitoring are used to in-situ monitor trim process, wherein the etch process monitoring comprises directing radiation having an intensity modulated at a frequency of about 10 Hz onto the substrate, collecting a portion of the radiation reflected from the substrate, measuring an intensity of wavelengths in a spectrum of the radiation reflected from the substrate, and using a correlation between a spectral position of a minimum in the spectrum and a width of the structures formed on the substrate; and
(f) terminating the trim process when the etch process monitoring indicates that the mask has been trimmed to pre-determined dimensions.

29. The method of claim 28 wherein the mask is a photoresist patterned mask.

30. The method of claim 28 wherein the mask is trimmed using a plasma process.

31. The method of claim 28 wherein the pre-etch measurement information is obtained using optical metrology.

32. The method of claim 31 wherein the optical metrology comprises one or more techniques selected from the group consisting of interferometry, scatterometry, reflectometry and ellipsometry.

33. The method of claim 28 wherein the etch process monitoring is performed using optical metrology.

34. The method of claim 33 wherein the optical metrology comprises one or more techniques selected from the group consisting of interferometry, scatterometry and reflectometry.

35. The method of claim 28 wherein the etch process monitoring further comprises:
using a correlation between a vertical etch rate and a horizontal etch rate.

36. The method of claim 28 wherein the radiation is directed substantially perpendicular to the substrate.

37. The method of claim 28 wherein a spectrum of the radiation directed onto the substrate comprises wavelengths in a range from about 200 to 800 nm.

* * * * *